(12) United States Patent
Yilmaz

(10) Patent No.: US 10,396,150 B2
(45) Date of Patent: Aug. 27, 2019

(54) VERTICAL POWER TRANSISTOR DIE WITH ETCHED BEVELED EDGES FOR INCREASING BREAKDOWN VOLTAGE

(71) Applicant: MaxPower Semiconductor, Inc., San Jose, CA (US)

(72) Inventor: Hamza Yilmaz, San Jose, CA (US)

(73) Assignee: MaxPower Semiconductor, Inc., San Jose, CA (US)

( * ) Notice: Subject to any disclaimer, the term of this patent is extended or adjusted under 35 U.S.C. 154(b) by 31 days.

(21) Appl. No.: 15/597,024

(22) Filed: May 16, 2017

(65) Prior Publication Data

US 2017/0250173 A1   Aug. 31, 2017

Related U.S. Application Data

(63) Continuation of application No. 15/259,877, filed on Sep. 8, 2016, now Pat. No. 9,825,128.
(Continued)

(51) Int. Cl.
*H01L 29/06* (2006.01)
*H01L 29/739* (2006.01)
(Continued)

(52) U.S. Cl.
CPC ...... *H01L 29/0634* (2013.01); *H01L 21/2253* (2013.01); *H01L 21/26513* (2013.01);
(Continued)

(58) Field of Classification Search
CPC ........... H01L 29/66348; H01L 29/7396; H01L 29/7397; H01L 29/7395; H01L 29/66734; H01L 29/7811
See application file for complete search history.

(56) References Cited

U.S. PATENT DOCUMENTS 5,445,986 A   8/1995   Hirota
5,736,462 A   4/1998   Takahashi et al.
(Continued)

OTHER PUBLICATIONS

PCT/US16/51679 USPTO as ISA, "International search report and written opinion", dated Feb. 2, 2017, 9 pages.

*Primary Examiner* — Jose R Diaz
(74) *Attorney, Agent, or Firm* — Patent Law Group LLP; Brian D. Ogonowsky

(57) ABSTRACT

Various improvements in vertical transistors, such as IGBTs, are disclosed. The improvements include forming periodic highly-doped p-type emitter dots in the top surface region of a growth substrate, followed by growing the various transistor layers, followed by grounding down the bottom surface of the substrate, followed by a wet etch of the bottom surface to expose the heavily doped p+ layer. A metal contact is then formed over the p+ layer. In another improvement, edge termination structures utilize p-dopants implanted in trenches to create deep p-regions for shaping the electric field, and shallow p-regions between the trenches for rapidly removing holes after turn-off. In another improvement, a dual buffer layer using an n-layer and distributed n+ regions improves breakdown voltage and saturation voltage. In another improvement, p-zones of different concentrations in a termination structure are formed by varying pitches of trenches. In another improvement, beveled saw streets increase breakdown voltage.

8 Claims, 16 Drawing Sheets

Related U.S. Application Data

(60) Provisional application No. 62/244,120, filed on Oct. 20, 2015.

(51) Int. Cl.

| | | |
|---|---|---|
| *H01L 21/225* | (2006.01) | |
| *H01L 21/265* | (2006.01) | |
| *H01L 21/304* | (2006.01) | |
| *H01L 21/306* | (2006.01) | |
| *H01L 21/324* | (2006.01) | |
| *H01L 29/10* | (2006.01) | |
| *H01L 29/66* | (2006.01) | |
| *H01L 29/78* | (2006.01) | |
| *H01L 29/40* | (2006.01) | |

(52) U.S. Cl.
CPC ...... *H01L 21/304* (2013.01); *H01L 21/30604* (2013.01); *H01L 21/324* (2013.01); *H01L 29/0619* (2013.01); *H01L 29/0623* (2013.01); *H01L 29/0661* (2013.01); *H01L 29/0696* (2013.01); *H01L 29/1095* (2013.01); *H01L 29/407* (2013.01); *H01L 29/66348* (2013.01); *H01L 29/66734* (2013.01); *H01L 29/7397* (2013.01); *H01L 29/7811* (2013.01); *H01L 29/7813* (2013.01); *H01L 29/0638* (2013.01)

(56) References Cited

U.S. PATENT DOCUMENTS

| | | | |
|---|---|---|---|
| 6,479,876 B1 | 11/2002 | Deboy et al. | |
| 8,426,949 B2 * | 4/2013 | Seki | H01L 29/0603 257/622 |
| 8,519,477 B2 * | 8/2013 | Hsieh | H01L 21/823481 257/330 |
| 8,928,030 B2 * | 1/2015 | Lu | H01L 29/32 257/131 |
| 9,224,802 B2 * | 12/2015 | Hiyoshi | H01L 29/66068 |
| 9,634,087 B1 | 4/2017 | Xie | |
| 9,698,246 B1 | 7/2017 | Edwards et al. | |
| 2004/0012057 A1 | 1/2004 | Bennett et al. | |
| 2009/0065902 A1 * | 3/2009 | Yu | H01L 21/3043 257/620 |
| 2010/0059797 A1 | 3/2010 | Ngai et al. | |
| 2016/0308071 A1 | 10/2016 | Lin et al. | |
| 2017/0194149 A1 | 7/2017 | Chang et al. | |

\* cited by examiner

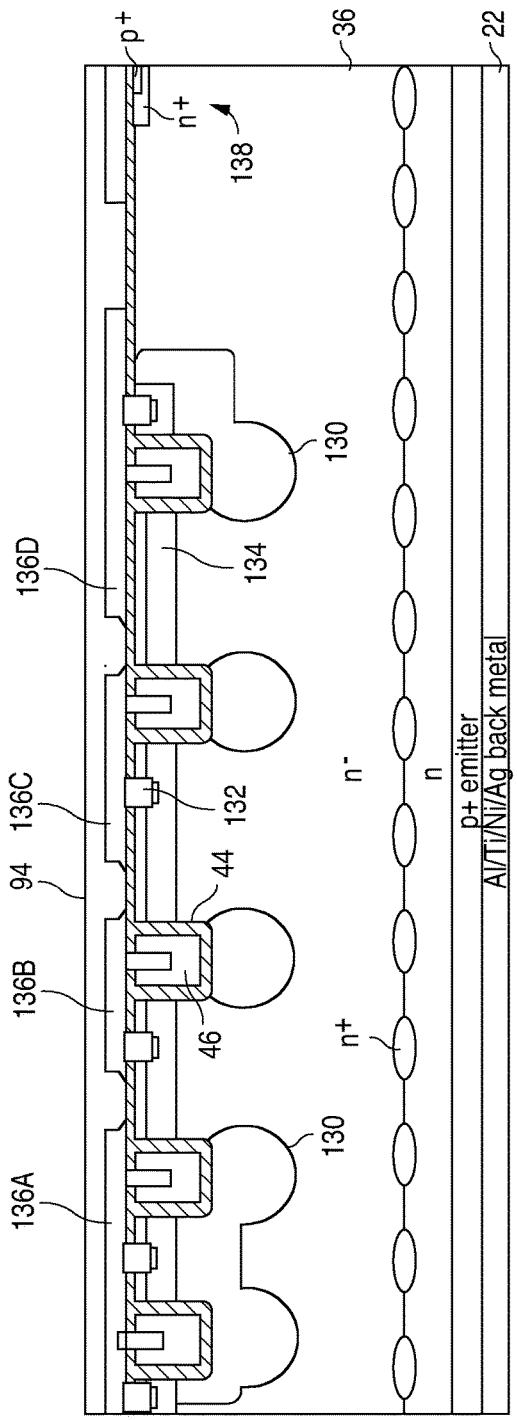
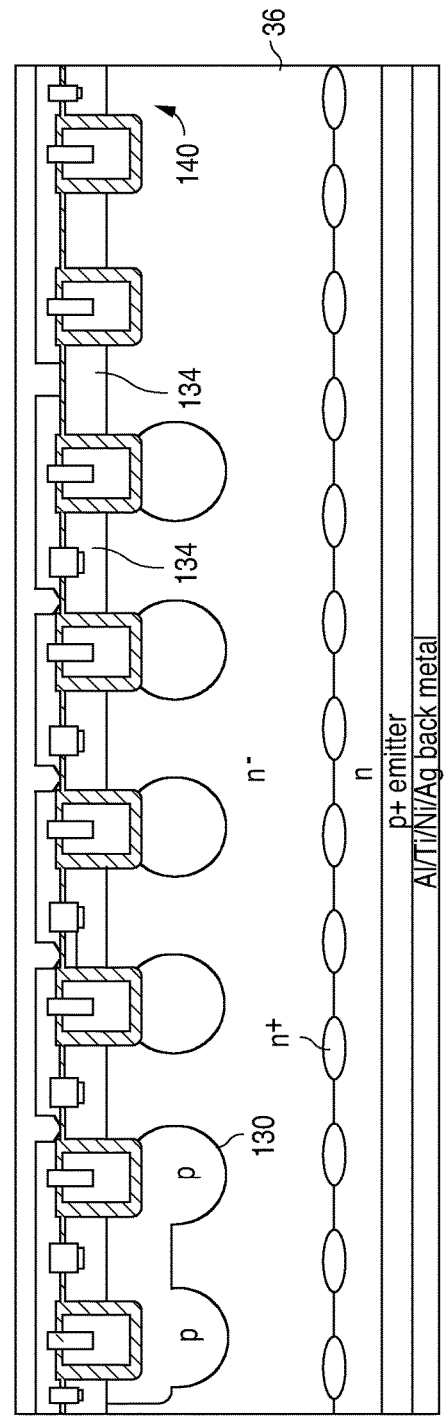
FIG. 17
FIG. 18

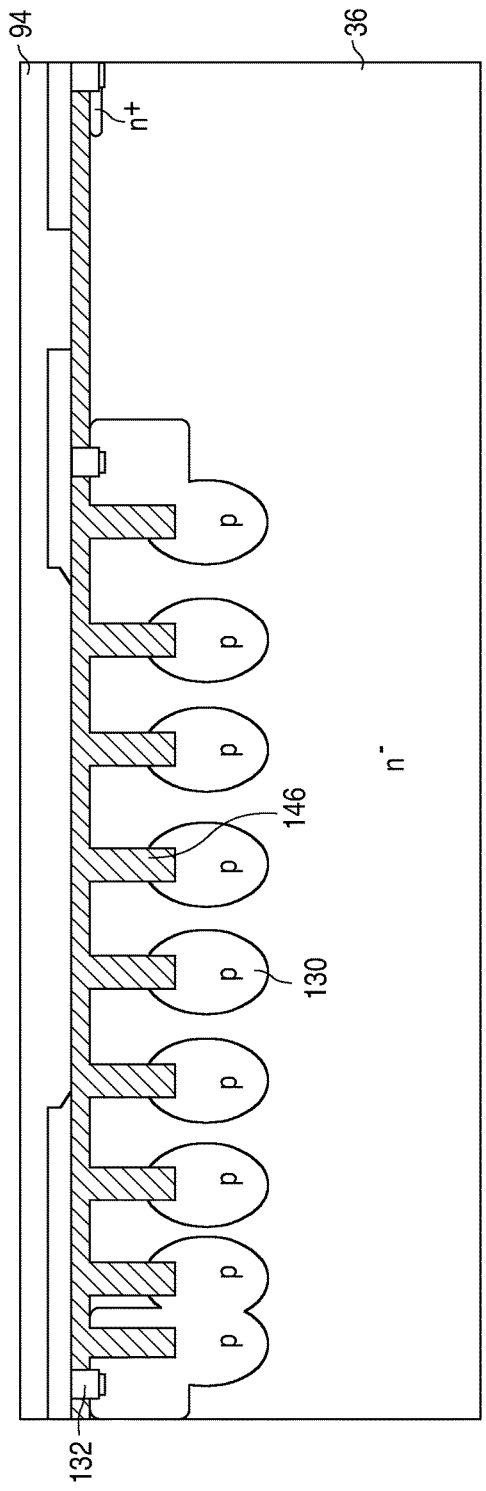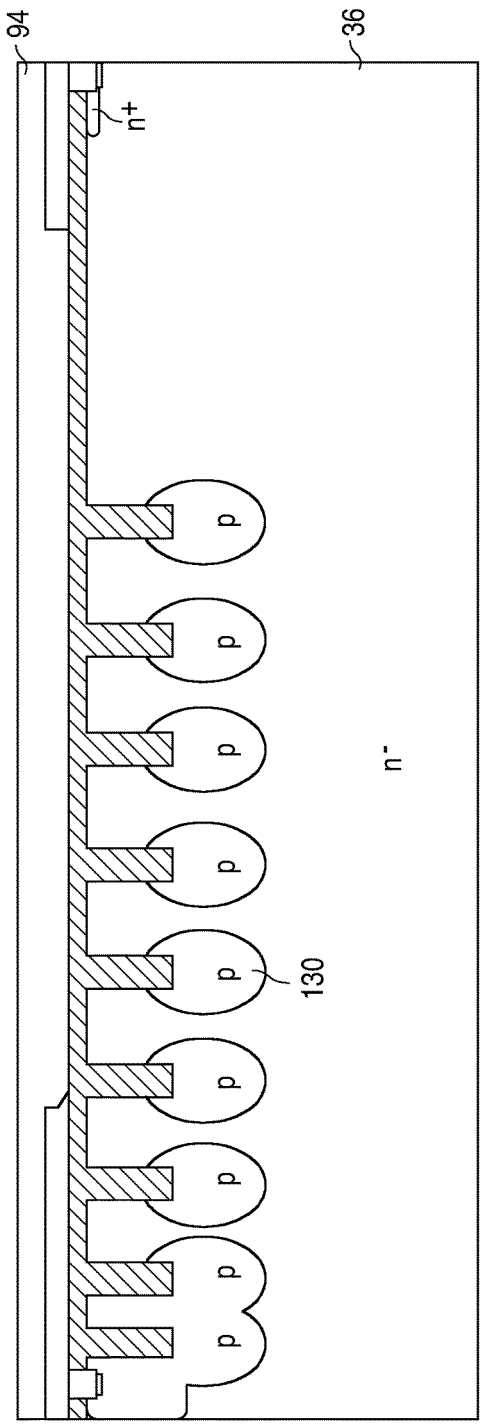

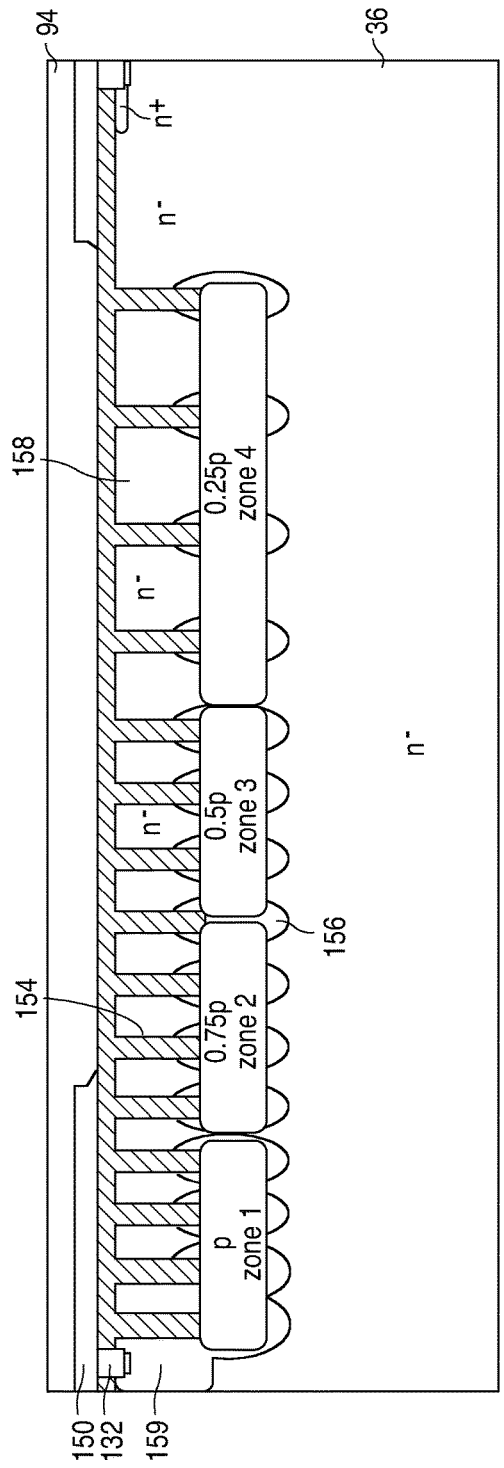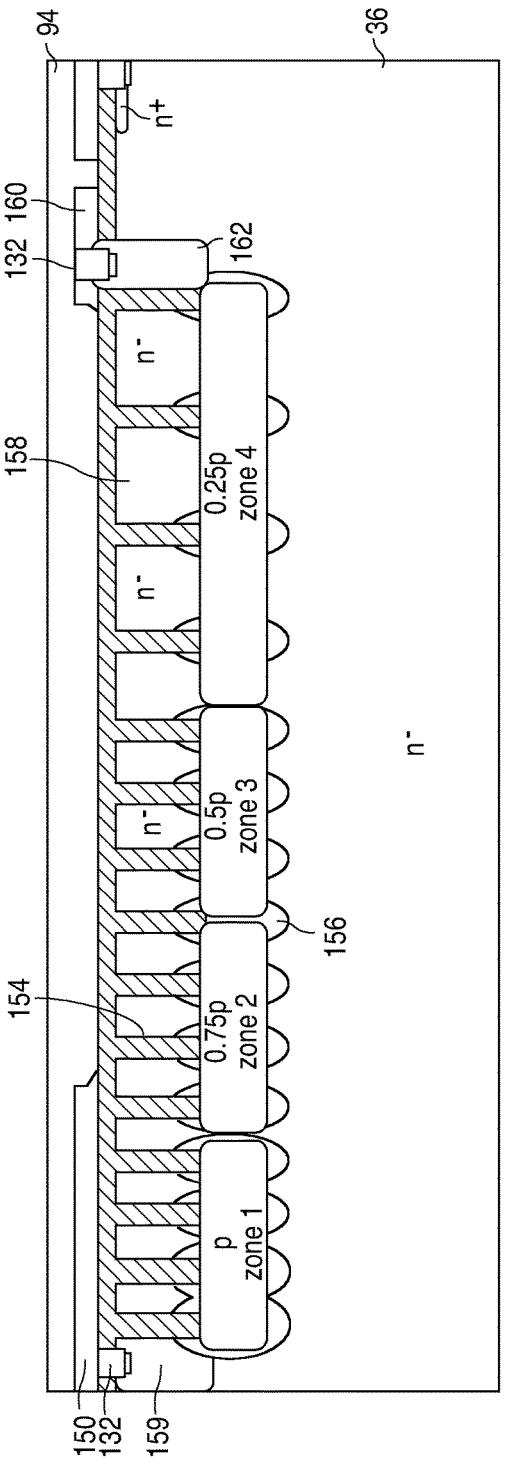

VERTICAL POWER TRANSISTOR DIE WITH ETCHED BEVELED EDGES FOR INCREASING BREAKDOWN VOLTAGE

CROSS REFERENCE TO RELATED APPLICATIONS

This application is a continuation of U.S. application Ser. No. 15/259,877, filed Sep. 8, 2016, which claims priority from U.S. provisional application Ser. No. 62/244,120, filed Oct. 20, 2015, by Hamza Yilmaz, assigned to the present assignee and incorporated herein by reference.

FIELD OF INVENTION

The present invention relates to insulated gate devices, such as vertical insulated gate bipolar transistors (IGBTs), and, in particular, to a termination structure of such a transistor die to reduce electrical field crowing near the edge of the transistor die for increased breakdown voltage.

BACKGROUND

Although the present invention can be applied to a variety of vertical insulated gate devices, an IGBT will be used as an example.

One type of common vertical IGBT contains a vertical pnp bipolar transistor (formed of many cells in parallel) which is driven by a MOSFET that begins the injection of carriers, which then fully turns on the pnp transistor. At high current levels, the forward voltage drop in a vertical IGBT (Vce-sat) is typically lower than that of a vertical MOSFET. In high power IGBTs that handle high currents and high voltages, such as for industrial motor control, induction heating, etc., the n-type base needs to be relatively lightly doped to create a wide depletion layer to withstand the high voltage in the off-state. This thick and lightly doped n-type base layer is a bottleneck to lowering the Vce-sat. When the transistor is switched from on to off, it is important to quickly remove holes from the n-type base to rapidly stop the current flow.

A thinner, more heavily doped p-type emitter (which may be the bottom semiconductor layer of the IGBT) desirably increases hole injection efficiency and reduces the Vce-sat of the IGBT. There is, however, a trade-off between increased injection efficiency and the turn off speed of the IGBT. A thin p-type emitter layer is typically formed after completing the front end processes (i.e., after forming the transistor layers), where the bottom surface of the wafer (a silicon substrate) is mechanically ground down, followed by the p-type emitter dopants being implanted in the bottom surface, followed by an anneal step. A laser anneal is desirable, since the resulting heat does not cause any of the front-side dopants to further diffuse. This annealing step adds to the process complexity and requires specialized equipment.

It is desirable for the device to have a high breakdown voltage but a low Vce-sat. Breakdown (in the off-state) in the area of the active cells can cause permanent device failure, so it is desirable for the device to provide a breakdown path away from the delicate active cell array. Efficient handling of high voltages without damage is generally referred to as robustness.

Areas near the edges of the die are particularly susceptible to breakdown due to electric field crowding and should not be a bottleneck to the overall breakdown voltage of the device. Termination structures are typically used around the edges of the die for high power devices.

Improvements in all of the above-mentioned areas are desirable to create a more robust and efficient IGBT.

SUMMARY

The present disclosure describes IGBT structures and fabrication methods that reduce forward voltage drop (Vce-sat), improve turn-off time, and improve the robustness of the active cell array. The teachings can be applied to various other types of power devices.

In one embodiment, relatively shallow and narrow trenched gates are formed in the active cell array area to form MOSFETs or IGBTs, and wider deep trenches filled with the gate material are formed in a shield region surrounding the active area. Deep, floating p-regions are formed below the deep trenches (by implanting into the trenches), creating equi-potential rings around the active area to improve the breakdown voltage of the device. Shallower p-regions between the deep trenches in the shield region are shorted to the top source metal to quickly remove holes from the n-type base after the IGBT gate has been turned off to accelerate the turn off of current flow. The deep floating p-region area is designed to shield the shallow p-region from breakdown during normally off and IGBT turn-off modes.

If there are multiple sections of cell arrays, there may be a shield region around each cell array. A termination structure around the edges of the die may surround the cell arrays and shield regions.

The shield regions are designed to have a breakdown voltage that is lower than the breakdown voltage of the active area and the edge termination structure of the IGBT device. The shield region is very robust so there is typically no permanent damage to the device in the event of a breakdown, where the shield region shunts current away from the active area.

In addition, "hole by-pass p+ regions" adjacent to the deep trenches (in the shield region) are provided to drain holes in the n-type drift region safely away from the parasitic npn bipolar transistor of the shallow-trench MOSFET or IGBT to prevent triggering of a 4 layer, npnp parasitic thyristor inherent to such device structures. As a result of forming the "hole by-pass p+ regions" and deep p-regions beneath the deep trenches in the shield region, a MOSFET or IGBT device formed according to present invention will have an enhanced Safe Operation Area (SOA), defined as the voltage and current conditions over which the device can be expected to operate without damage.

In another embodiment, after implantation of the −p-type dopants into the deep trenches in the shield region, the trenches are filled with a dielectric. Metal rings are formed on the top surface above the dielectric and act as floating field plates. The dielectric-filled trenches act as vertical spacers between the metal rings and the deep p-regions, which is used to control the shape of the depletion region, which controls the breakdown voltage. The vertical depth difference between the deep p-region junction and its associated floating metal field plate sets the voltage in the associated metal ring.

In another embodiment of an IGBT structure, a segmented, highly doped n+ buffer layer (forming strips or dots) is formed on top of the conventional n buffer layer. The n+ segmented buffer layer portion increases the reach-through voltage to increase the breakdown voltage, but does not significantly reduce the hole injection efficiency of the bottom p-type emitter due to the gaps in the n+ segmented buffer layer. The n+ segmented buffer layer also lowers Vce-sat. This also allows the overlying n-type drift region to be thinner. Thus, the dual buffer layers result in reduced Vce-sat and increased breakdown voltage.

In another embodiment, an IGBT structure is formed with a segmented, highly doped and thin p-type emitter that avoids the need for laser annealing. A thinner p-type emitter (the bottom semiconductor layer of the IGBT) increases hole injection efficiency and reduces the Vce-sat of the IGBT. The method of forming a thin highly doped p-type emitter includes implanting cellular (e.g., dots) or strip regions of p-type dopants into the top surface of a p-type silicon substrate, using a mask, to form many p+ regions. Then, the various epitaxial layers are grown over the top surface, and doped regions are formed, to virtually complete the front-side processing of the IGBT. The various heating steps used for the front-side processing provides some drive-in and activation of the p-type dots/strips, which may somewhat merge the dots/strips but still result in high and low p-dopant concentrations in the top surface region of the growth substrate. After the front side processing, the back surface of the silicon wafer is mechanically ground down to about 80-90% of its final thickness, followed by a wet etch to expose the p-type dots on the bottom surface. The highly doped p+ areas act as an etch stop (optically detected by color) for the wet etch. The bottom surface does not have to be further heated by a laser to diffuse the p-type dots, easing processing requirements. Since the wet etch rate is dependent somewhat on dopant concentration, the resulting thinned substrate has a roughened bottom surface, which provides excellent electrical contact to a bottom electrode. A metal electrode layer is then deposited on the back surface, which directly contacts the exposed p-type dots. The metal layer may be annealed to improve contact resistance. The resulting p-type emitter layer is highly doped (referred to as p+) and very thin, which results in a higher efficiency IGBT.

Termination structures around the edges of the die are described which include trenches and deep p-regions below the trenches, formed by implanting through the trenches. In some embodiments, the trenches are filled with a conductive material to provide equi-potential rings. In other embodiments, the trenches are filled with a dielectric. In embodiments where the trenches are filled with a dielectric, the deep p-regions are connected to top metal rings acting as floating field plates for spreading the electric field. The dopant concentrations of the various deep p-regions can be varied by varying the pitch of the trenches so that the dopant concentration becomes lower toward the edge of the die to optimize the breakdown voltage.

Other embodiments are described.

BRIEF DESCRIPTION OF THE DRAWINGS

FIGS. 17-19 illustrate alternative embodiments of a high voltage termination area along the edge of the die, where the gate material fills wide and deep trenches surrounding a cell array, and where a deep p-region is below each trench. The various alternatives use different numbers of masks, which affects the cost of fabrication.

FIGS. 20-26 illustrates alternative embodiment of a termination area where a dielectric material fills wide and deep trenches surrounding a cell array, and where a deep p-region is below each trench. The various alternatives use different numbers of masks, which affects the cost of fabrication.

FIGS. 27-29 illustrate varying the spacing of the deep trenches in the termination area to achieve a tapered buried p-dopant concentration of the deep p-regions to further improve the breakdown voltage. The p-dopants are implanted through the trenches.

Elements that are identical or similar in the various figures are identified with the same numeral.

DETAILED DESCRIPTION

Although a vertical pnp IGBT device is shown in the figures, an npn IGBT may be fabricated by reversing the polarities of the various regions/layers. The teachings of this disclosure can easily be applied to a vertical MOSFET by replacing the p-type substrate with an n-type substrate.

Figure 1A:
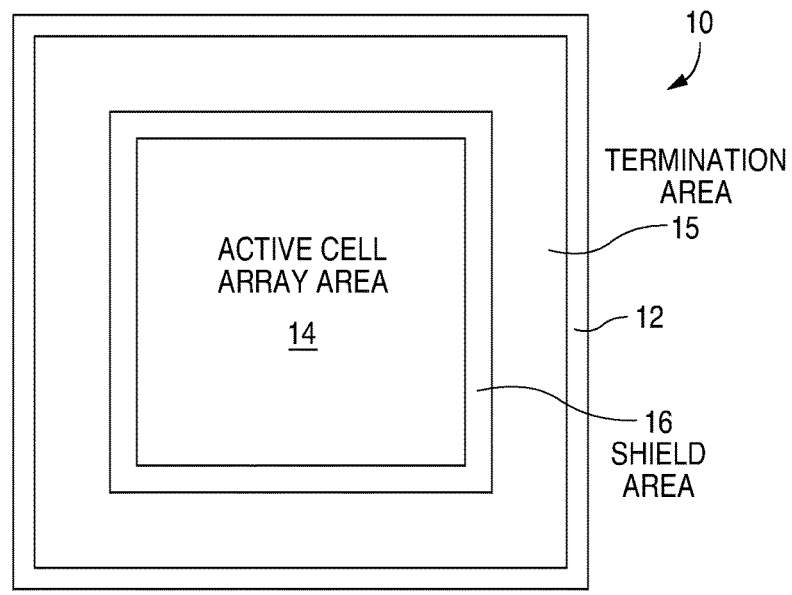
FIG. 1A is a top view of a die having a shield region along the perimeter of the central cell array (the active area) and a high voltage termination area along the edge of the die, forming an IGBT.

FIG. 1A is a top down view of an IGBT 10 in accordance with one embodiment of the invention. The silicon die has an outer edge 12. The IGBT 10 has a center portion comprising an array of cells 14 connected in parallel. As an overview, each vertical cell area comprises a top p-type collector of the pnp transistors, a p-body for inversion by a MOSFET portion to initiate turn-on, a top n+ source region, a thick n-base layer (including n-type buffer layers), a bottom p-type emitter layer, and a trenched gate adjacent to the n+ source region and p-body. A sufficiently high gate voltage creates an n-channel in the p-body to begin the flow of electrons from the n+ source into the p-type emitter of the vertical pnp transistor. As a result, holes from the p-type emitter are injected into the n-base layer. Injected holes from the p-type emitter and electrons from the n+ source region of the MOSFET, will cause electrons and holes to be stored inside the thick n-base region, which is called a base conductivity modulation effect. Because of the base conductivity modulation effect, the Vce-sat of the IGBT will be reduced. If, however, too much electron and hole pairs are stored inside the n-base layer, the IGBT turn off speed becomes very slow, and the IGBT dissipates too much power to be useful for many applications, even though Vce-sat is lower.

When the IGBT is off, there will typically be a high voltage between the top source metal and the bottom emitter metal. A large depletion region is formed in the thick n-base layer (a drift region) to withstand the voltage. By design, a shield cell (shield area 16) surrounding the active cells has the lowest breakdown voltage so it clamps the overall breakdown voltage of the IGBT. The shield area 16 around the inside of the high voltage termination area 15 (along the die edge 12) provides a safe path for holes in the n-base layer to discharge during turn off to accelerate the stoppage of current flow. The breakdown voltage of the shield area 16 is made slightly less than the breakdown voltage of the active area to avoid damage to the active area. Therefore, the IGBT is more robust. Greater detail is provided below with reference to FIG. 2.

Figure 1B:
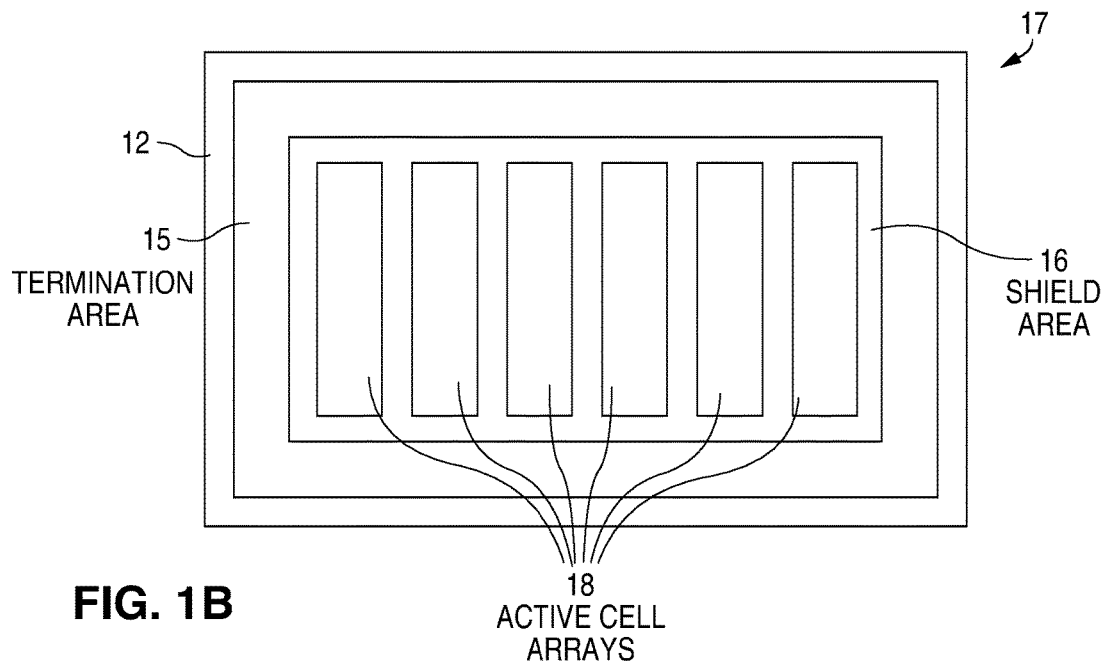
FIG. 1B is a top view of an IGBT die where each group of active cells is surrounded by a deep, floating p-shield area, and a high voltage termination area is along the edge of the die.

FIG. 1B is a top down view of another embodiment of an IGBT 17, where the cells are formed in strips 18, and a shield area 16 surrounds each of the strips 18. The high voltage termination area 15 along the edge of die is different from the shield area 16 between the strips 18. Other configurations are envisioned.

Deep and Shallow P-Regions in Shield Area Surrounding Active Cells

Figure 2:
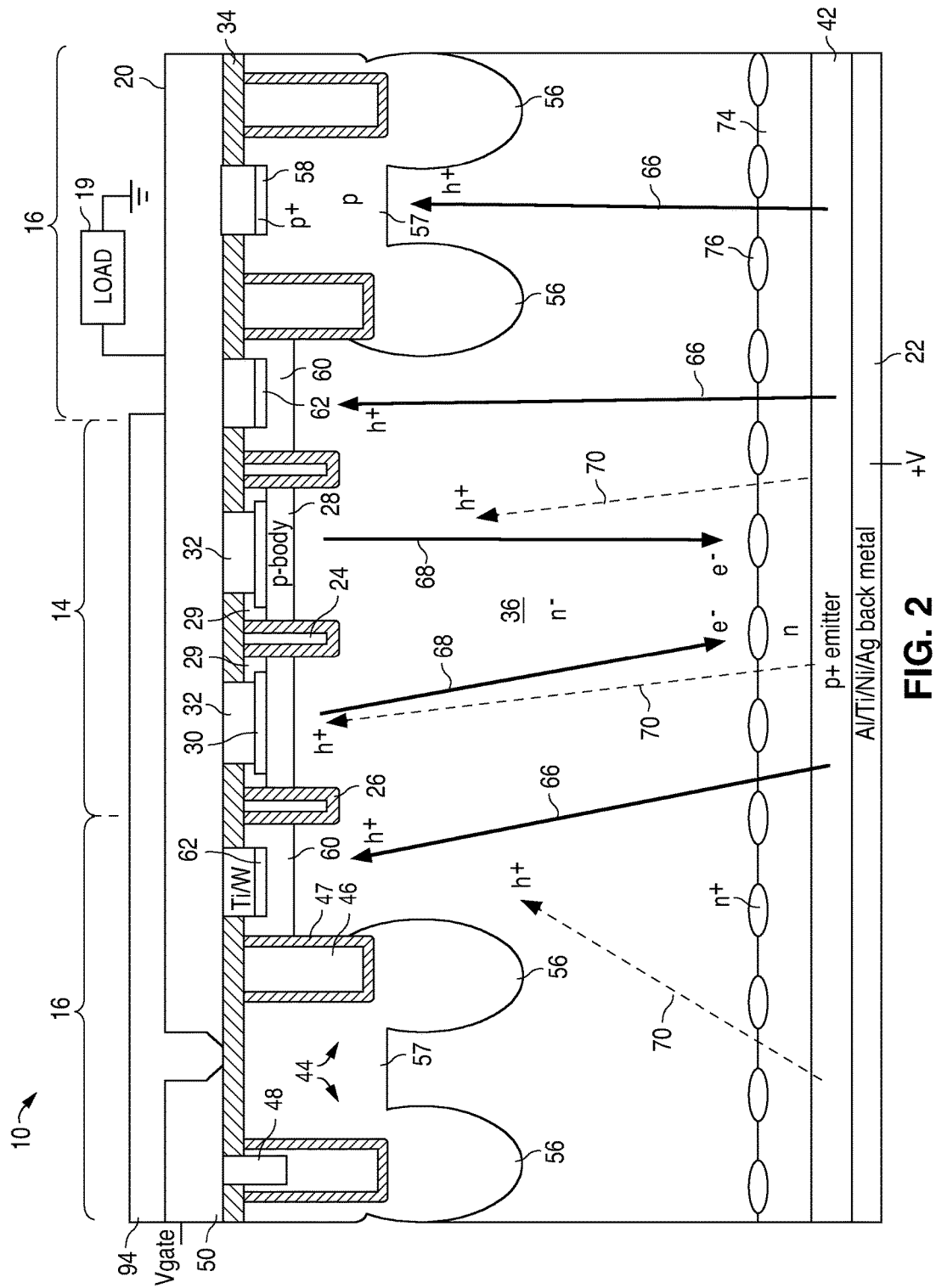
FIG. 2 is a cross-sectional view of one example of an active cell array and a deep floating p-shield region surrounding the active cell array. The active cell array shown may be an abbreviated version of a larger cell array in the center of a die (as shown in FIG. 1A) or a strip of cells (as shown in FIG. 1B). The p-type dopants for the deep p-regions in the shield region are implanted through the deep and wide trenches. The high voltage termination area along the edge of the die is not shown in FIG. 2, but is shown in other figures.

FIG. 2 is a cross-sectional view of the IGBT 10 or 17 showing an abbreviated array of cells 14 (in the case of FIG. 1A), or a narrow strip 18 of cells (in the case of FIG. 1B). The shield area 16 surrounds the array of cells 14 and is continuous around the array of cells 14. The shield area 16 around a group of cells may form a square ring (as shown in FIG. 1A), a rectangular ring (as shown in FIG. 1B), or other shape, such as a hexagon, circle, etc., depending on the shape of the array of cells 14.

In a typical application, a load 19, such as a motor, has one terminal coupled to ground and another terminal connected to the top source metal 20 of the IGBT 10. A positive voltage (e.g., 500V) is connected to the bottom emitter metal 22. When the IGBT 10 is turned on, approximately 500V is connected across the load 19. The IGBT 10 is typically a packaged die.

To turn the IGBT 10 on, assuming a sufficient potential is across the source metal 20 and emitter metal 22, a sufficiently positive gate-source voltage is applied to the trenched gates 24 in the cells 14. The gates 24 may be a doped polysilicon. The gates 24 are insulated by a thin dielectric 26. A p-body 28 and upper n+ source region 29 are between adjacent gates 24. The source metal 20 is connected to the n+ source region 29 and a p+ body contact region 30 by a Ti/W metal connector 32 extending through a dielectric layer 34.

The biased gates 24 invert the adjacent p-body region 28 to create a vertical n-channel between the n+ source region 29 and the lightly doped n− base layer 36. Current then flows vertically between the n+ source region 29 and bottom p-type emitter layer 42 (forming a forward biased pnp bipolar transistor driven by an n-channel MOSFET). The high doping of the emitter layer 42 causes the doping level to be preferably p+.

The initial current due to the MOSFET action causes holes to be injected into the n-base layer 36, which turns on the vertical pnp bipolar transistor formed by the p+ contact region 30, p-body region 28, n-type base layer 36, and p-type emitter layer 42 to further reduce the forward voltage drop, Vce-sat.

To turn the IGBT off, the positive gate-source voltage is removed, and the n-base layer 36 is discharged by the p-body region 28, p+ contact region 30, and source metal 20. The gates 24 may be shorted to the source metal 20 or connected to a slightly negative voltage.

The trenched gates 24 in the array of cells 14 are relatively shallow and only need to be slightly deeper than the p-body regions 28.

The shield area 16 contains deeper and wider trenches 44 filled with the gate material 46 (e.g., doped polysilicon). A dielectric 47 lines the deep trenches 44. The gate material 46 is electrically connected to the various shallow gates 24 via a metal contact 48 and the gate metal 50. In one example, the gates 24 may be on the order of 1.5 μm deep, while the gate material 46 in the deep trenches 44 may be about 2-2.5 μm deep and wider than the gate 24. As described later, the larger widths of the deep trenches 44 (defined in a masking step) cause them to be etched deeper than the narrow trenches during the same etching step so there are no extra steps in forming the deep trenches 44.

Between the deep trenches 44 and below the deep trenches 44 is a lightly doped p-region that comprises deep p-regions 56 below the deep trenches 44 and a shallower p-region 57 between the deep trenches 44. The deep p-regions 56 may extend down, for example, to 2 μm below the deep trenches 44. The deep p-regions 56 are also referred to as p-shields. The deep p-regions 56 have a high resistivity due to the low doping concentration and are weakly biased by the p+ contact regions 58 distributed around the shield area 16, which are connected to the source metal 20.

In the off-state, the shallower p-region 57 and n-base layer 36 are reversed biased. The deep p-region 56 lowers the electric field under the trench 44, since the p-region 56 is fully depleted prior to breakdown, which results in a higher breakdown voltage (given a particular dopant concentration of the n-base layer 36). The p-region 56 also serves to laterally deplete the n-base layer 36 to further increase the breakdown voltage. The p-region 56 region can be completely floating, but to switch the device on from the off state, the parasitic capacitor resulting from the depletion layer has to be discharged. Therefore it is preferable to "weakly" connect the p-region 56 to the source metal 20 via the p+ contact region 58 in certain locations of the die to discharge the capacitor and lessen the switching delay during switching the device from the off to the on state.

When the IGBT 10 is off, the n-base layer 36 and p-regions 56/57 become depleted, depending on the magnitude of the potential difference, and the doping causes the shield area 16 to break down at a voltage slightly less than the breakdown voltage in the array of cells 14 area. This prevents damage to the active cells after a breakdown. It is important for the cells 14 to not be affected by a breakdown, since a damaged cell may draw more current and lead to thermal runaway in that cell area. The optimal doping levels can be determined by simulation since they are affected by many factors.

Between the deep trenches 44 is the shallower p-type region 57. When the IGBT 10 is turned off, the holes remaining in the n-type base layer 36 are withdrawn by the p-regions 56/57, and primarily by the shallower p-region 57 proximate to the p+ contact regions 58, distributed around the shield area 16, to more quickly turn off the IGBT 10 (i.e., the n-type base layer 36 is discharged). Holes are also withdrawn through the p-body regions 28 in the array of cells 14.

Additionally, another portion of the shield area 16 is formed between the innermost deep trench 44 and the array of cells 14. This area comprises the shallow p-region 60 that has the same dopant concentration as the p-body regions 28, and is more heavily doped than the p-regions 56/57 around the deep trenches 44. Holes are also swept up by the shallow p-region 60 via the p+ contact region 62 and the source metal 20. There is no n+ source region above the p-region 60, since this is not a MOSFET area.

FIG. 2 illustrates, by arrows 66, some arbitrary hole collection trajectories in the shield area 16 (for improving turn-off speed), which are referred to as hole bypass regions since some of the hole-sweeping bypasses the hole sweeping by the cells 14. Additionally, arrows 68 identify the downward direction of electron injection from the n+ source regions 29 regions when the IGBT is on. The upward direction of some holes injected by the p− type emitter layer 42 during the on-time is indicated by the arrows 70.

Since the lightly doped p-regions 56/57 deplete along with the n-base layer 36 in the off-state, the n-base layer 36 can be more highly doped than conventional n-base layers to reduce the Vce-sat without reducing the breakdown voltage.

The shield area 16 can be located around the entire array of cells or around groups of cells, such as a group of cells formed as strips. In the example of FIG. 2, the cells may be parallel strips of the various regions and gates going into and out of the drawing. The shield area 16 can surround any number of cells. Other shapes of cells may be squares, hexagons, etc. In one embodiment, where the cells are formed as groups of long strips, the shield area 16 surrounds up to twenty cell strips. There may be any number of groups of the strips connected in parallel depending on the current requirements of the IGBT.

Dual n and n+ Buffer Layers

The n-type buffer layer 74 and the n+ dots 76 (or alternatively n+ strips) formed over the buffer layer 74 are also novel. The buffer layer 74 and n+ dots/strips 76 reduce the on-resistance and the saturation voltage Vce-sat drop across the IGBT while maximizing the breakdown voltage (when the IGBT is off) by preventing the depletion region in the n-base layer 36 reaching the p-type emitter layer 42 (stops reach-through). The buffer layer 74 may be about 5 μm thick. Arsenic or antimony n-type dopants are preferred over phosphorous due to the slower diffusion. The holes from the p-type emitter layer 42 are only injected into the n-base layer 36 between the n+ dots/strips 76, as shown by the arrows 70. By spreading out the n+ dots/strips 76, holes can be injected from the p-type emitter layer 42 through the n-buffer layer 74 between the n+ dots/strips 76, while the n+ dots/strips 76 serve to reduce the saturation voltage drop, Vce-sat. The n+ dots/strips 76 also quickly sweep up stored charges in the n-base layer 36 for a faster turn-off time and allow the n-buffer layer 74 to be thinner for reduced Vce-sat. In addition, the combination of n-buffer layer 74 and n+ dots/strips 76 can be used to customize the trade-off between Vce-sat and turn-off time switching speed by adjusting the density of the doping of the buffer layer 74 and the spacing between the n+ dots/strips 76.

The fabrication of the device of FIG. 2 is described below, which includes novel processes for forming the bottom portion of the wafer and other features. Various other embodiments of termination areas and processing options are also described later.

Figure 3:
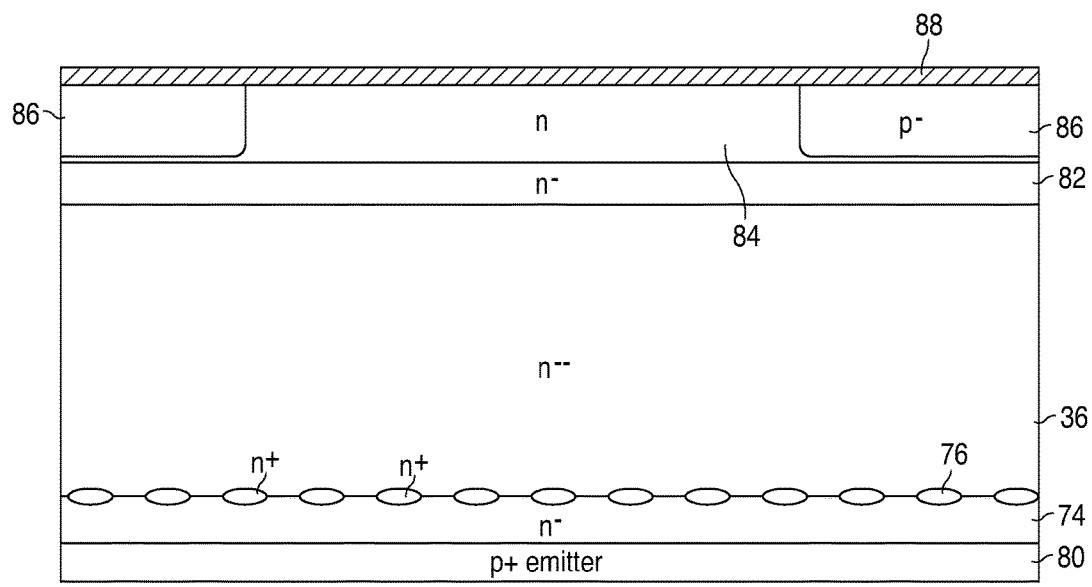
FIGS. 3-10 illustrate fabrication steps in the formation of the IGBT of FIG. 2.

Referring to FIG. 3, the starting substrate 80 is a p-type. The n-type buffer layer 74 is then epitaxially grown. A masking and implant step forms the n+ dots/strips 76. The high resistivity n-base layer 36 is then grown. The thickness and doping depend on the desired breakdown voltage. A more highly doped n-layer 82 is then grown over the n-base layer 36, followed by an even more highly doped n-layer 84. The layers 82 and 84, in one example, form the top 6-9 μm of the semiconductor layers of the IGBT to form a tapered dopant concentration for optimizing Vce-sat and breakdown voltage.

The surface is then selectively masked, and a p-dopant implant forms the p-tubs 86 after a drive-in step.

After the formation of the p-tubs 86, a SiO2/Si3N4/SiO2 hard mask layer 88 is deposited.

Figure 4:
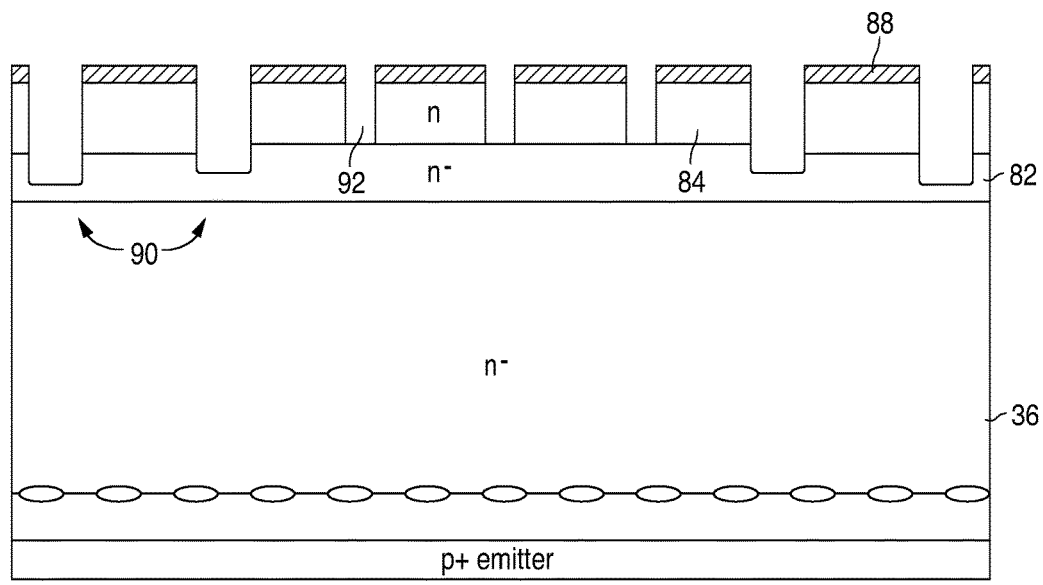

Referring to FIG. 4, the mask layer 88 is patterned to form the trenches, and the trenches are etched using RIE. The wide openings in the mask layer 88 will inherently form deeper trenches 90 at the same time that the narrow openings in the mask layer 88 will form the shallower trenches 92. The etching is stopped after the shallower trenches 92 reach their target depth, which is approximately the depth of the n-layer 84. The shallower trench 92 depth may be about 1.5-2.5 μm.

Figure 5:
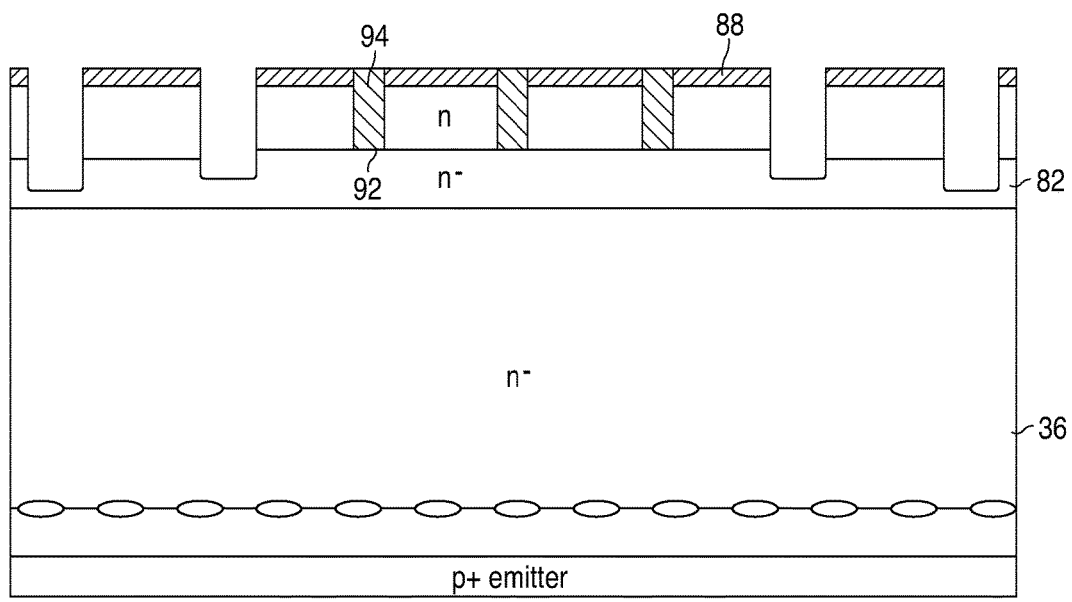

Referring to FIG. 5, the shallower trenches 92 are filled with a masking material 94, such as oxide or photoresist using well known process techniques.

Figure 6:
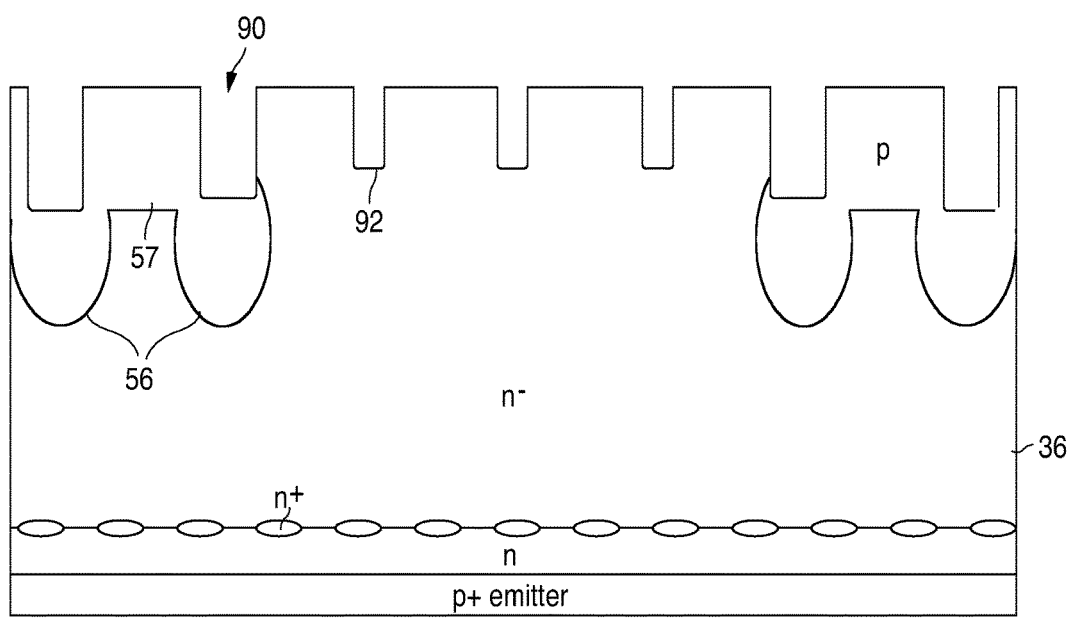

Referring to FIG. 6, while the shallow trenches 92 are still filled with the masking material 94 (FIG. 5), a p-type dopant is implanted through the deep trenches 90 and driven in to form the deep p-regions 56. The p-tub 86 from FIG. 3 now forms the shallower p-region 57. The hard mask layer 88 is then removed. The n-layers 82 and 84 (FIG. 5) are not shown as separate layers in the subsequent figures, since there is now a smooth n-type dopant concentration variation from the top down to the n-base layer 36. All oxide is then removed to expose the shallower trenches 92.

Figure 7:
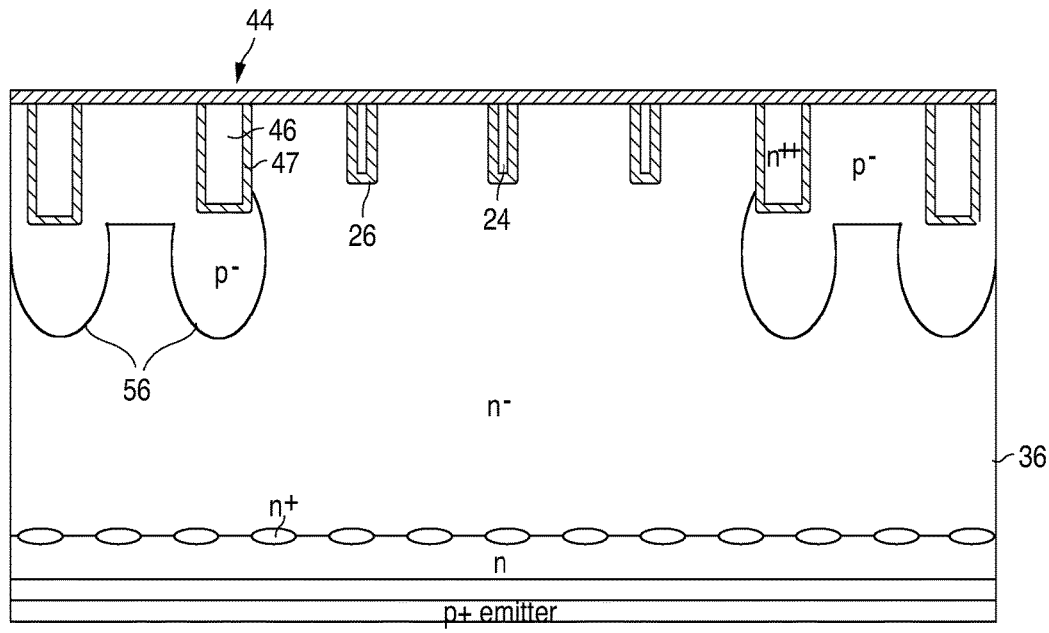

Referring to FIG. 7, the wafer is oxidized to form the gate dielectric 26 (500-1200 Angstroms) and the dielectric 47 on the deep trench 44 sidewalls. A doped polysilicon is then deposited to fill in all the trenches to form the gates 24 and the gate material 46 in the deep trenches 44. The wafer is then planarized to remove the polysilicon from the top surface.

Figure 8:
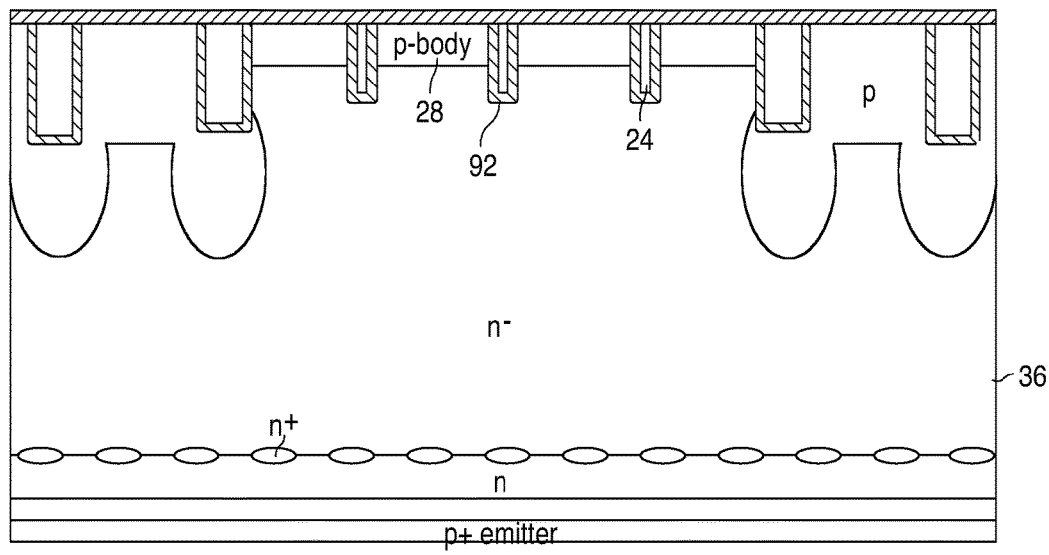

Referring to FIG. 8, a p-body mask (not shown) is formed to expose areas adjacent the shallow trenches 92, and a p-type dopant is implanted and driven in so that the p-body 28 does not extend below the gates 24.

Figure 9:
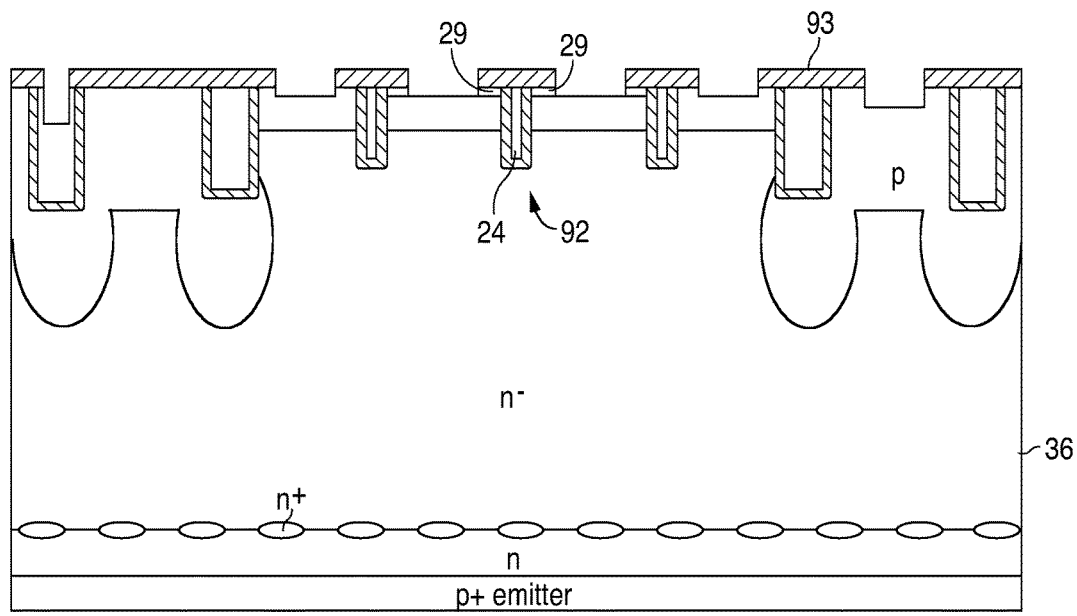

Referring to FIG. 9, a mask (not shown) exposes areas between the shallower trenches 92, and n-type dopants are implanted and driven in to form a shallow top n+ source layer. A BPSG mask 93 is then deposited to expose center areas of the n+ source layer. An RIE etch removes the center portions of the n+ source layer to form n+ source regions 29 adjacent to the shallow gates 24.

Figure 10:
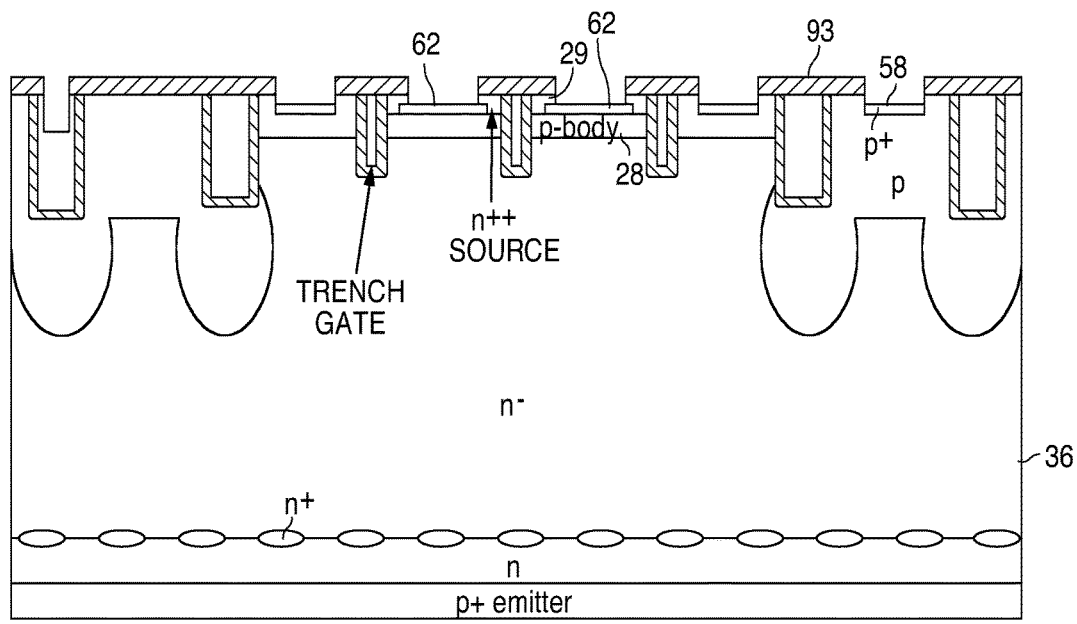

Referring to FIG. 10, a p-dopant implant (boron) is performed, using the same mask 93, to form the p+ contact regions 62. The boron dose is less than the source dopant implant dose.

Referring back to FIG. 2, Ti/W metal connectors 32 are then deposited in the mask 93 (FIG. 10) openings, and the surface is planarized. The dielectric layer 34 in FIG. 2 is the BPSG mask 93 in FIG. 10. An aluminum source metal 20 is then deposited and patterned to make electrical contact to the various n+ source regions 29 and p+ contact regions 62. The gate metal 50 electrically contacts the various gates 24 (in the shallower trenches) and gate material 46 filling the deeper trenches 44. The conductive polysilicon forming the gates may be used to electrically connect all the gate material together outside of the plane of FIG. 2. The gate metal 50 is isolated from the source metal 20, and the gate/source metal layer 50/20 is covered with an oxide/ nitride passivation layer 94 except for pad opening areas for wire bonding package terminals to the source metal 20 and gate metal 50.

FIGS. 2-11 illustrate the shield areas 16 with a narrow active area (array of cells 14) between the shield areas 16, and where each shield area 16 has two deep trenches 44 with a deep p-region 56 below each trench 44 for improving the breakdown voltage, and a shallower p-region 58 between the trenches 44 for rapidly sweeping up holes after the IGBT is switched off to lessen the turn off time. As previously mentioned, the robust termination areas break down at a voltage slightly less than the breakdown voltage of the active area (the array of cells 14) to protect the cells 14.

Figure 11:
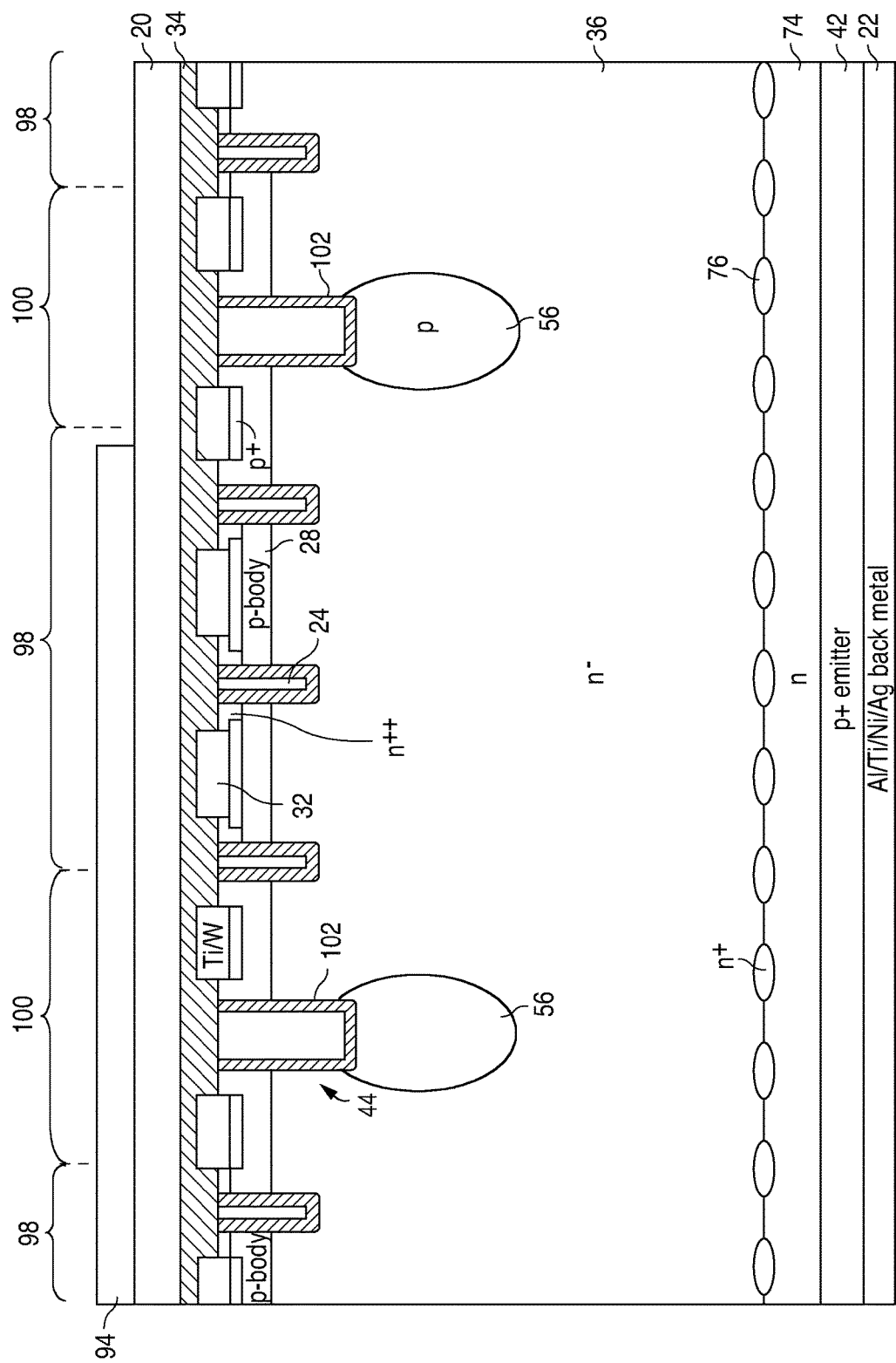
FIG. 11 illustrates a variation of the IGBT of FIG. 2, where there is no shallow p-region between the deep trenches in the shield region for removing holes from the n-base layer after turn-off.

FIG. 11 shows another embodiment of an IGBT with a repeated active area 98 surrounded by shield areas 100, where there is only one deep trench 102 per shield area 100 for improving the breakdown voltage of the IGBT. All other aspects are the same as in FIG. 2.

Formation of Backside Features, Including Highly Doped p-Type Dots or Strips in the p-Type Emitter The novel formation of the backside surface of the wafer will now be described. It is desired to have a very thin, highly doped bottom p-type emitter layer for the most efficient hole injection. The disclosed process forms such a thin, highly doped bottom p-type emitter layer without substantially diffusing dopants in the front side, and the resulting bottom surface is roughened by a wet etching process to improve electrical contact with a bottom metal electrode.

Figure 12:
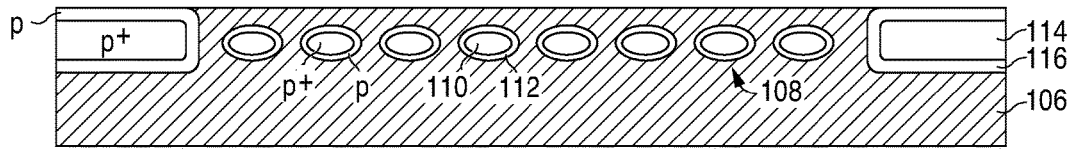
FIGS. 12-14 illustrate steps for forming the highly doped and very thin bottom p-type emitter layer.

Referring to FIG. 12, a p-type starting substrate 106 (a wafer) is used. Only the area of a single die is shown in the silicon wafer. A mask (not shown) is deposited over the top surface of the substrate 106 to create small openings over the center portions of the intended die areas and wider openings at the edges of the die areas. A high energy p-type dopant implant (boron) is performed with a dose of 5E14-1E16 $cm^{-2}$. This creates small stripes or dots 108 of more heavily doped p-type material in the p− substrate 106. The dots 108 have a heavily doped p+ center 110 and a lesser doped p shell 112. Due to the wider openings at the edges of each die area, the implant results in deeper p+ centers 114 and p shells 116. The dopants are not driven in at this time.

Figure 13:
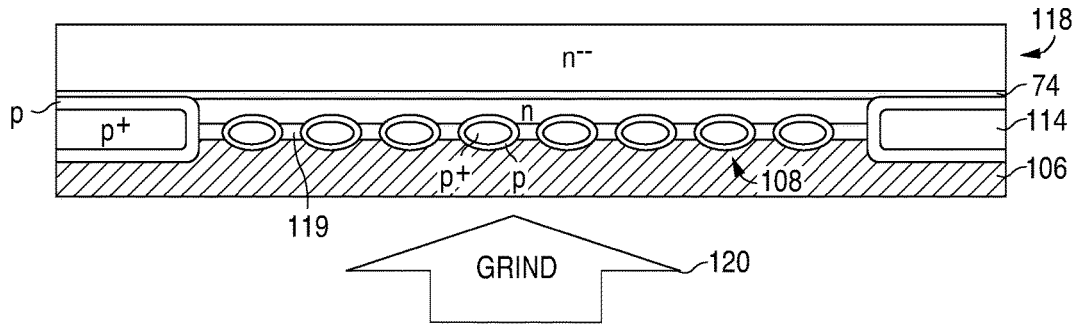

Referring to FIG. 13, the various layers of an IGBT structure, which can be either conventional or that shown in FIG. 2, are epitaxially grown over the top surface of the substrate 106, and the various regions and gates are formed to complete the front side processing. The front-side layers are not shown in detail in FIG. 13 and are labeled 118 over the n-buffer layer 74 (which may comprise the dual buffer layers previously described). The various thermal steps for the front-side processing perform an initial drive-in of the p-dopants implanted in the top surface region of the substrate 106, and the p-dopant spreading is shown by the layer 119, so the dots 108 can somewhat merge. The bottom surface of the substrate 106 is then mechanically ground down 120 to just below the bottom of the p-type implant dots 108, which is about 80-90% of the final thickness of the substrate 106.

Figure 14:
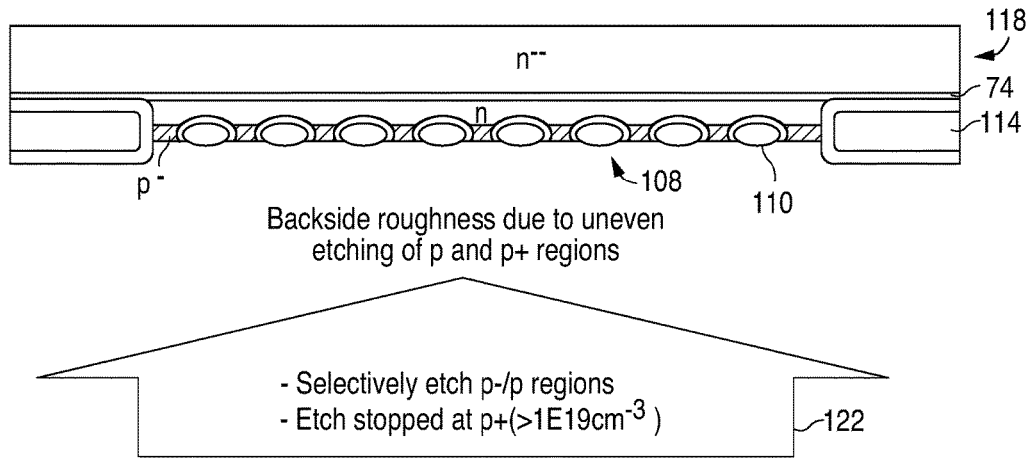

Referring to FIG. 14, a slow anisotropic etchant 122, such as KOH, tetramethyl ammonium hydroxide (TMAH), ethylene diamine pyrochatechol (EDP), or a mixture is applied to the back surface to remove the silicon until the p+ centers 110 of the dots 108 (having a dopant concentration of >1E19 $cm^{-3}$) are optically detected (changes color). Therefore, the p+ silicon acts as an etch stop and results in a minimum thickness of the p-type emitter of the IGBT. The wet etchant is preferably selective in that it has a different etch rate depending on the crystal direction of the silicon. The bottom surface is relatively rough after the wet etching due to different etching rates of the p and p+ areas, which improves metal-to-silicon electrical contact. An additional boron implant may be conducted to improve ohmic contact.

In the course of heating the wafer during the various steps of fabrication, the dots 108 may merge or may spread to form closely spaced p+ regions. In any event, the bottom of the IGBT surface will be essentially a p+ type layer. The back metal 22 (Al/Ti/Ni/Ag) is then deposited and sintered at a temperature at or below 450° C., which further diffuses the p-dopants. The resulting p-type emitter layer 42 (FIG. 2) may be less than 2 μm, and in one embodiment is less than 1 μm.

The wafer is then sawed along the lines corresponding to the locations of the wider p+ centers 114 and p-shells 116 to singulate the IGBT dies.

Figure 15:
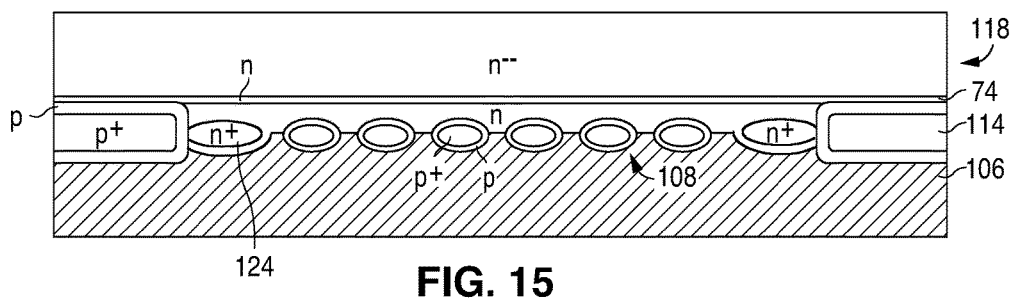
FIGS. 15 and 16 illustrate steps for forming another embodiment of the highly doped and very thin bottom p+ emitter layer, where an additional n+ region is formed to provide reverse conduction through the IGBT in the event the voltage polarities are reversed.

Referring to FIG. 15, a modification to the bottom surface structure is shown to form a reverse conducting IGBT, where n+ dots 124 are formed near the edges of each die area by masking the surface of the substrate 106 (prior to the top layers being formed) using a 5E15-1E16 $cm^{-2}$ phosphorous implant. The same processes described above are used to thin/etch the substrate 106 and drive in the dopants. The density of the n+ dots 124 can also be increased, for example, to completely fill the spaces between the p+ dots 108.

Figure 16:
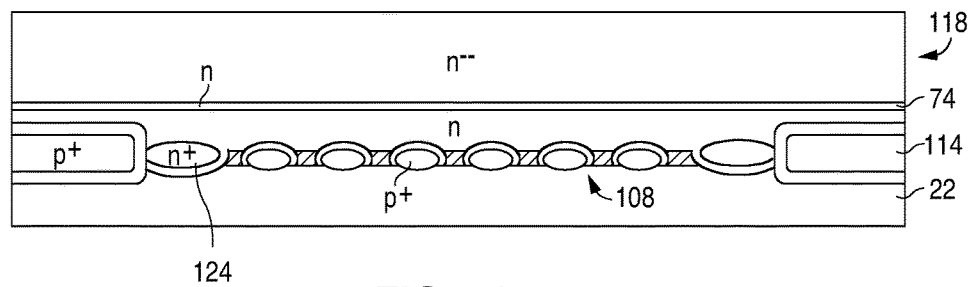

Referring to FIG. 16, the bottom surface is then metallized for form the metal layer 22, which contacts the p+ and n+ portions of the bottom semiconductor layer. The n+ dots 124 directly contact the n− buffer layer 74 and metal layer 22 to allow a reverse current flow through the IGBT in the event there is a reverse polarity event, since a forward biased diode is now formed when a the bottom metal layer 22 is sufficiently negative with respect to the top source metal layer.

High Voltage Edge Termination Options

Figure 19:
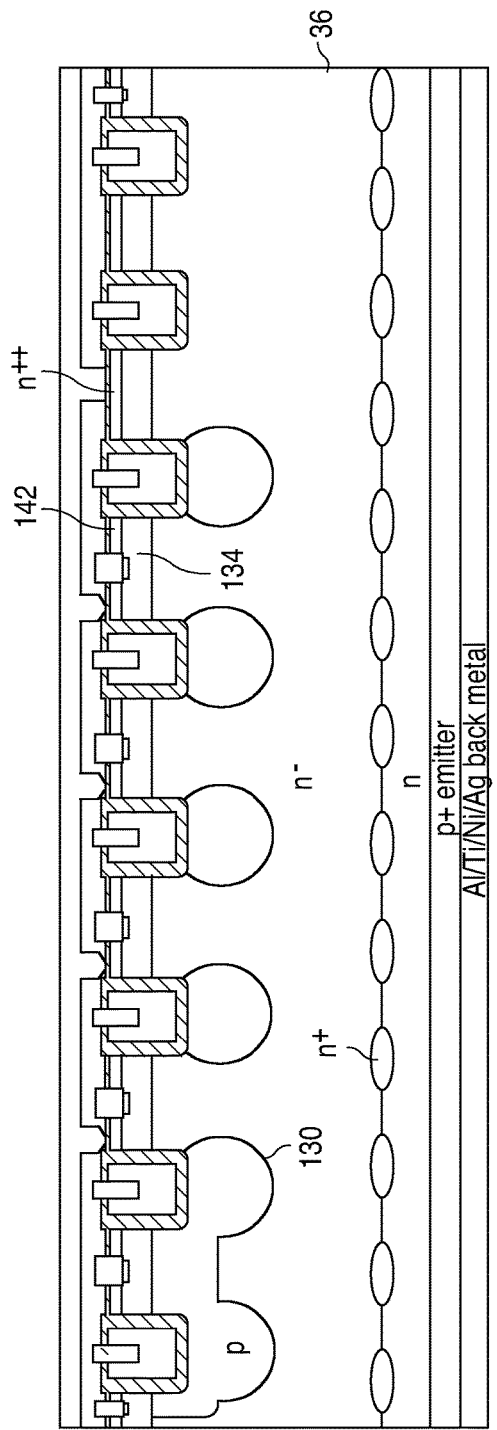

Various termination structures around the edges of the die or array of cells are described below that are particularly useful for very high voltage IGBTs, such as over 500V. Edges of a die for a high power transistor are particularly susceptible to breakdown due to the asymmetry at the die's edge. FIGS. 17-19 show termination options where trenches are filled with a doped polysilicon, and the remaining figures show termination options where trenches are filled with a dielectric such as oxide (SiO2).

FIG. 17 shows one embodiment of buried field rings formed by deep p-regions 130 below deep trenches 44 filled with the gate material 46. The deep p-regions 130 are formed in the same way as the deep p-regions previously described, by implanting through the trench. The deep p-regions 130 can also be referred to as floating guard rings. Between the trenches is a p-type region 134 formed at the same time as the p-body regions 28 (FIG. 2) of the IGBT. The gate material 46 and p-type regions 134 are electrically connected using metal contacts 132 to associated floating metal rings 136A-136D, which are also referred to as field plates. The floating metal field plates are isolated from each other and equalize the voltage below each of the rings 136A-136D to limit the electrical fields and maximize the breakdown voltage. The active area containing a cell array and a shield area (not shown) are to the left of the termination structure. A channel stop area 138 near the outer edge of the die area prevents the formation of parasitic channels and prevents the depletion region from extending to the very edge of the die. The floating deep p-regions 130 enable the n-base layer 36 to be more highly doped (to reduce Vce-sat) while not decreasing the breakdown voltage of the device.

As the n-base layer 36 is depleted, the depletion punches through the various floating deep p-regions 130 (starting from the innermost floating p-region 130) and pins the potential of the deep p-regions 130. The p-regions 130 inject a small amount of holes, and the lost charge is replaced by the depletion of the n-base layer 36 from the outer edge of the p-region 130. Such action successively occurs from the inner deep p-region 130 to the outer deep p-region 130. In this way, there is a smooth depleted region toward the edge of the die.

The various additional embodiments described below may be different from other embodiments simply by eliminating one or more masks, resulting in similar performance but fewer fabrication steps.

FIG. 18 is similar to FIG. 17 but where the p-body implant to make the p-regions 134 extends to the channel stop area 140. Therefore, a masking step is saved by not masking off the right edge of the die area from the p-body implant.

FIG. 19 is similar to FIG. 18 except the n-dopant implant used to form the n+ source regions 29 (FIG. 2) also forms the n+ regions 142 between the trenches, thus eliminating another masking step.

Figure 20:
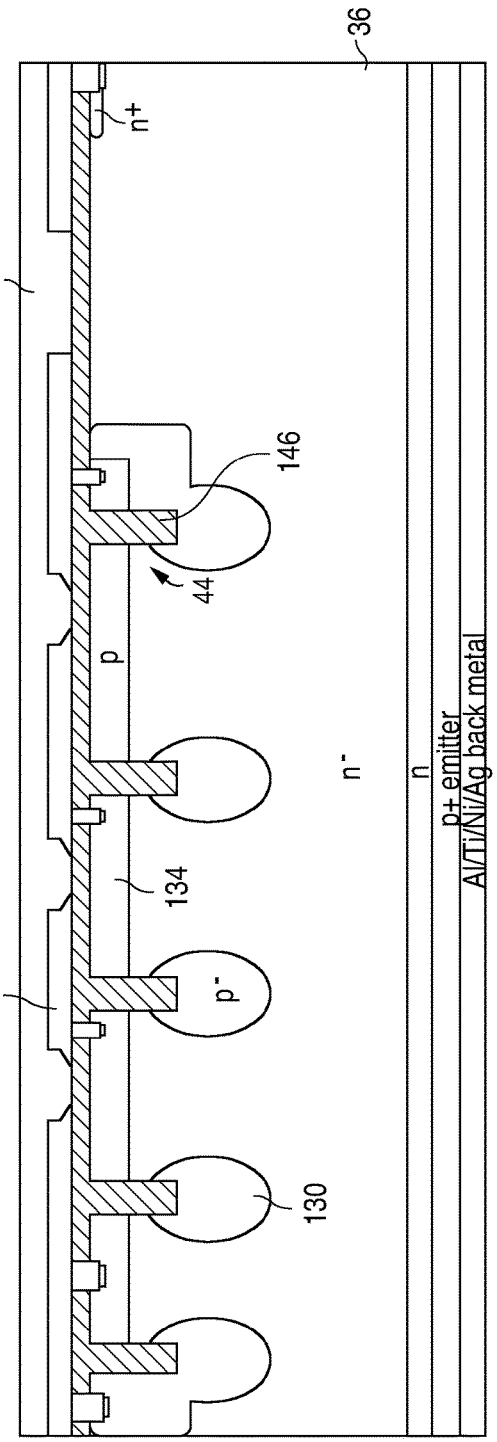

Deep Trenches Filled with Dielectric to Vertically Space Floating Metal Rings and Deep P-Regions FIG. 20 is similar to FIG. 17 but fills the trenches 44 with a dielectric 146 rather than conductive polysilicon. The trenches 44 (prior to being filled with the dielectric 146) are implanted with a p-type dopant to form the deep p-regions 130. The overlying metal forms the floating metal rings, such as ring 136B, acting as floating field plates. The dielectric-filled trenches act as vertical spacers between the deep p-regions 130 and the associated metal rings 136, which can be used to control the shape of the depletion region. In this structure, the vertical depth difference between the deep p-region 130 junction depth and the depth of the dielectric-filled trenches sets the voltage in each floating field ring.

FIG. 21 is similar to FIG. 20 except there is no p-region 134 (FIG. 20) formed during the p-body implant and there are fewer metal field plates.

FIG. 22 is similar to FIG. 21 except there is no middle metal field plate.

Figure 23:
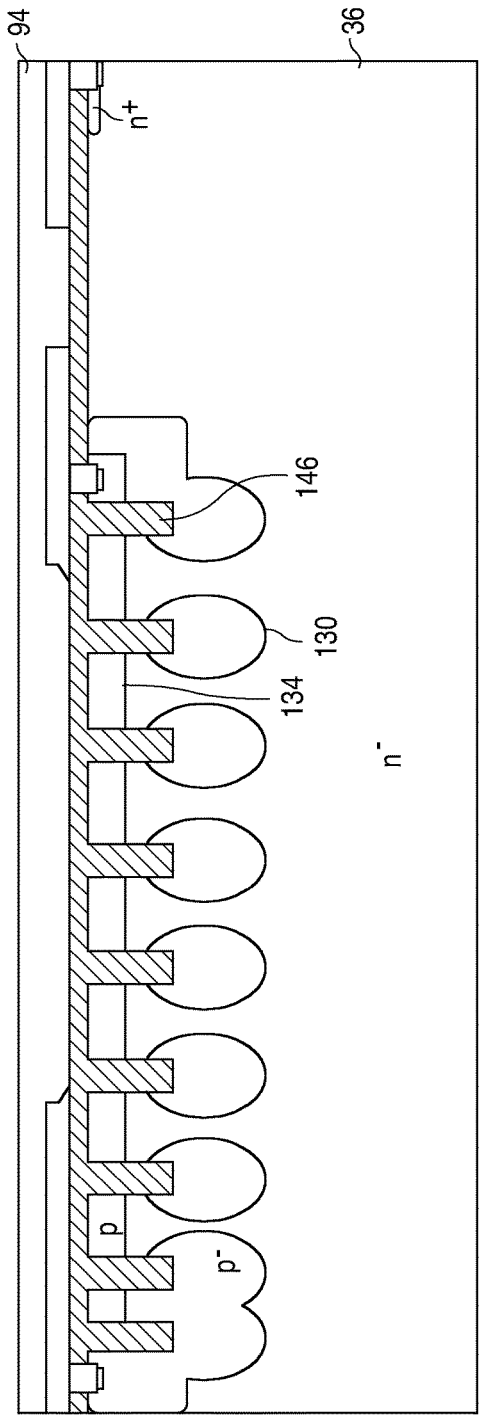

FIG. 23 is similar to FIG. 21 except there is a p-region 134, formed during the p-body implant, between the trenches filled with the dielectric 146, thus eliminating one masking step.

Figure 24:
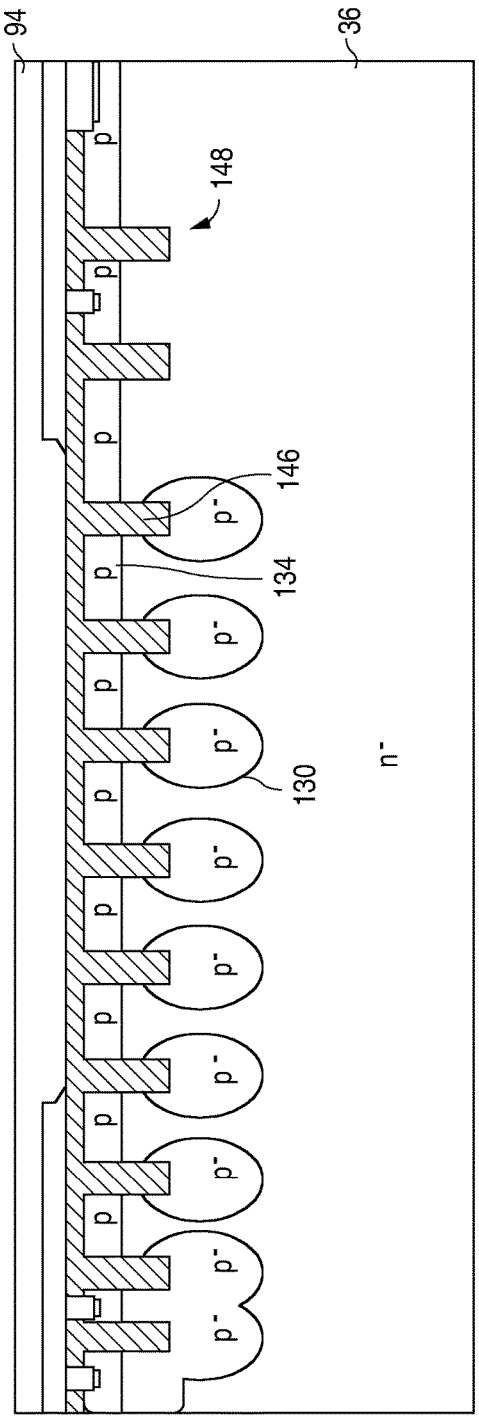

FIG. 24 is similar to FIG. 23 but using a trenched channel stop region 148.

Figure 25:
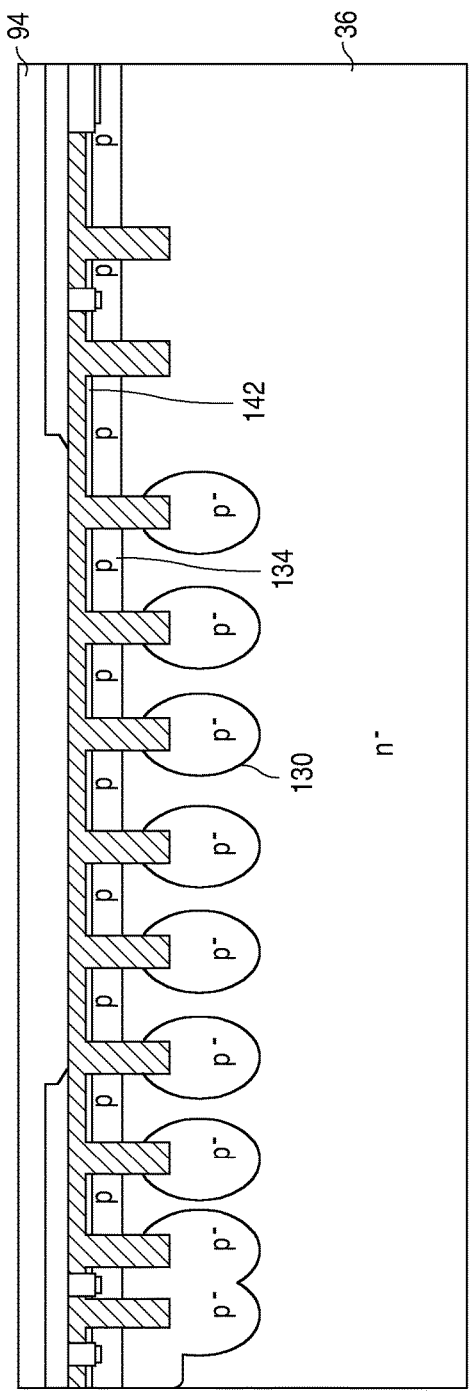

FIG. 25 is similar to FIG. 24 but includes an n+ layer 142 formed during the implant of n-type dopants used to form the n+ source regions in FIG. 2, thus eliminating both a p-body and an n+ source implant masking step.

Figure 26:
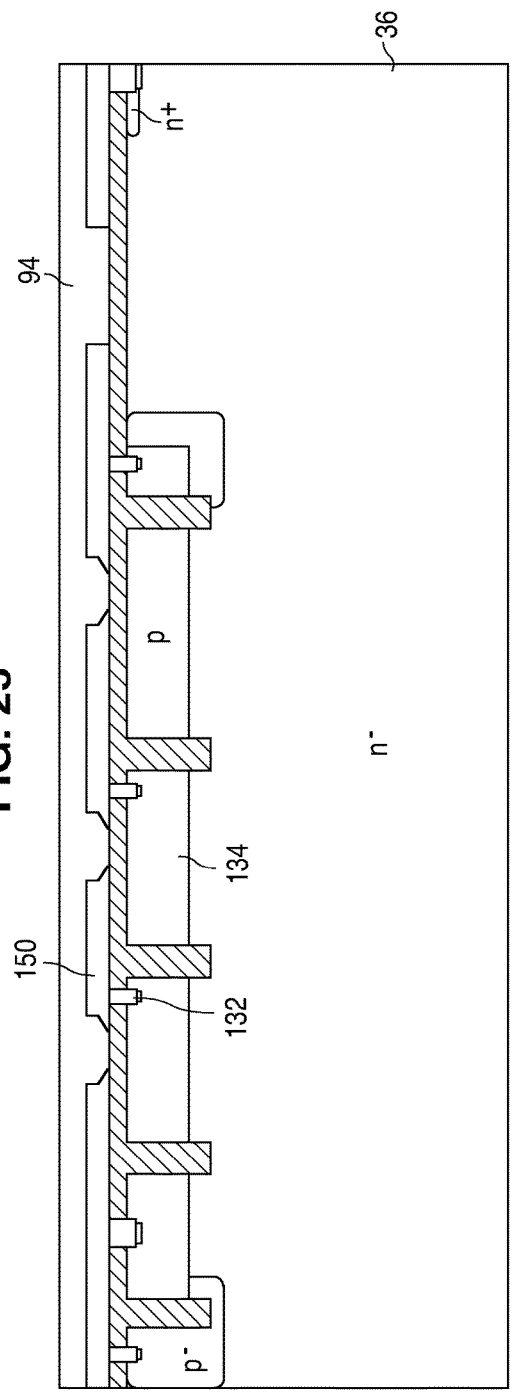

FIG. 26 does not form deep p-regions but relies on the p-regions 134, connected to their associated metal floating field plates 150 by metal contact 132, to provide a smooth transition to the edge of the die.

FIG. 27 illustrates a termination area using buried Junction Termination Extension (JTE). After trench 154 etching, p-type boron is implanted in the range of 1-4E12 $cm^{-2}$ with high energy for a deep implant. After diffusion, those implanted pockets of p-regions 156 merge together to form zones (zones 1-4) with different average p doping concentrations. The trenches 154 are spaced wider apart toward the edge of the die, and the silicon mesa size between the trenches 154 determines the p-charge in each zone. The zones and relative percentages of p-dopant concentration are superimposed over the p-regions 156, where the dopant concentration reduces towards the edge of the die. There are smaller mesas in zone 1 and larger mesas in zone 4. More zones can be added to maximize breakdown voltage and to minimize breakdown variance with process changes, and minimize breakdown variance with different polarities and amounts of oxide charges. The tapered dopant concentrations more evenly spread the electric field. The merged p-regions 156 are electrically coupled to the metal field plate 150 via a p-region 159 and metal contact 132. The metal field plate 150 may be connected to a reference voltage or floating. The n− regions 158 (part of the n-base layer 36) between the surface and the p-regions 156 are segmented by the dielectric-filled trenches 154. These floating n− regions 158 will assume the local potential of the neighboring zone. This will make the termination area insensitive to oxide charge variations and variations in n-dopant concentration in the top region/surface.

FIG. 28 is similar to FIG. 27 except there is an additional, outer field plate 160 electrically coupled to the merged p-regions 156 via a p-region 162 and metal contact 132.

Figure 29:
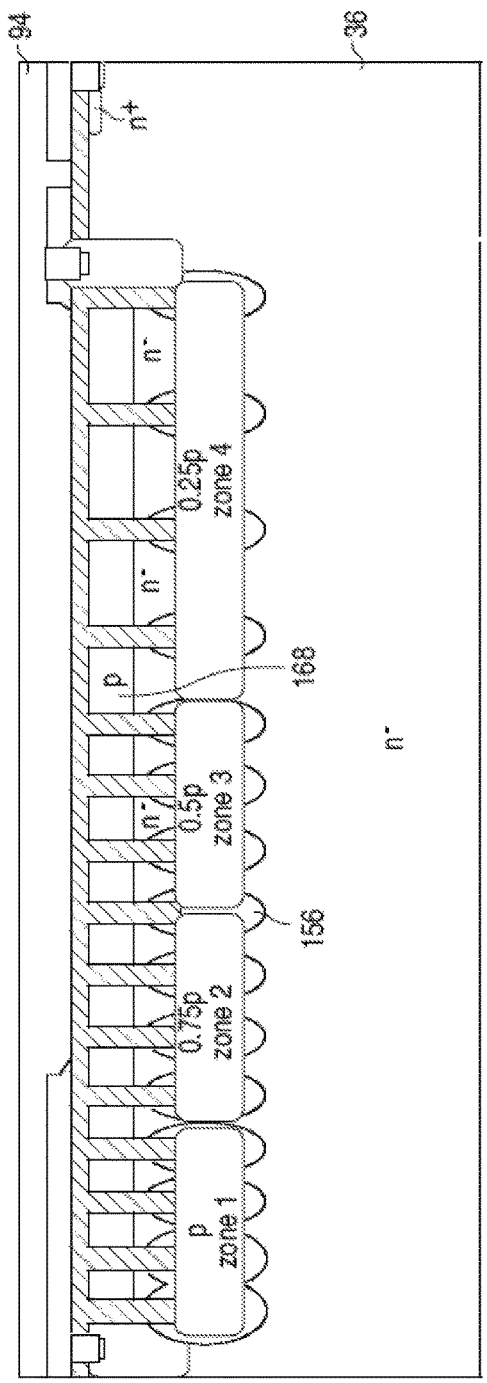

FIG. 29 is similar to FIG. 28 except there is a p-body implant forming p-regions 168, which saves a masking step.

Beveling Edge of Die Increases Breakdown Voltage

Figure 30:
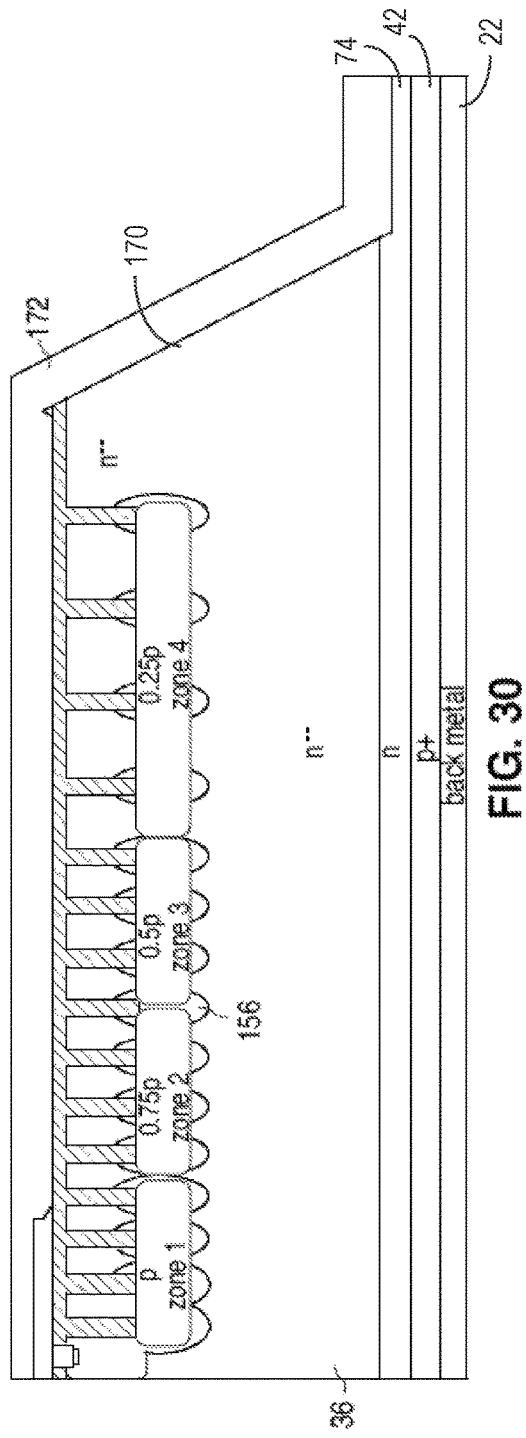
FIG. 30 illustrates beveling the edge of the die to improve the breakdown voltage for very high voltage IGBTs (e.g., >1700V).

FIG. 30 illustrates the very edge of the die area, where a mask is used to etch the edges of the die areas on the wafer to form a beveled edge 170 along the saw streets for singulation. A masked wet etch will form such a beveled edge. The surface is then passivated with a layer 172 of oxide/nitride. The dies are then singulated between the beveled edges 170 of adjacent die areas. The beveled edges allow the IGBT to support voltage exceeding 1700V due to better electric field distribution resulting from the beveled edge.

CONCLUSION

Various inventions disclosed herein, providing improvements for an IGBT or other power transistor, include but are not limited to:

1. Periodic, highly doped p-type emitter dots or strips (FIGS. 12-14) are formed in the top surface region of a growth substrate, followed by growing the various transistor layers. The dots/strips may somewhat merge due to the various heating steps. The bottom surface of the substrate is then ground down, followed by a wet etch to expose the highly doped p-type silicon. The highly doped p-type emitter dots or strips (or merged layer) identify an etch stop during the wet etch, resulting in a very thin p-type emitter. The thin p-type emitter enables a highly efficient IGBT with low Vce-sat. The dots/strips also create a roughened bottom surface after the wet etch for improved metal-to-substrate contact.

2. A termination structure (FIGS. 20-25) is formed to surround a cell array, where a dielectric fills deep trenches, where a deep p-region is below each trench (by implanting into the trench), where a floating metal ring (a field ring) is over each trench to provide highly controllable termination characteristics, and where the vertical depth difference between the deep p-region junction and its associated metal ring sets the voltage of each floating ring to improve the breakdown voltage.

3. A dual buffer layer (FIG. 2) over a p-type substrate (emitter) is formed comprising a first n layer over the substrate and a thin second n+ layer over the first n layer for reducing the Vce-sat while maximizing breakdown voltage by stopping reach-through. The n+ layer may be formed by dots or strips, and hole injection from the p-type substrate is between the dots/strips. Thus, hole injection efficiency is not adversely affected by the n+ layer.

4. Deep and wide trenches (FIG. 2) are formed with deep p-regions below the trenches surrounding a cell array for controlling the breakdown voltage, along with shallower p-regions between the deep p-regions for quickly removing holes for a rapid turn off of the device and for preventing thyristor action occurring. A conductive material fills the trenches.

5. In a termination area (FIGS. 27-29), an array of trenches is formed with varying pitches, then p-type dopants are implanted into the trenches. The trenches are wider apart toward the edge of the die. After diffusion, the p-regions merge and form lateral p-type zones with different average p doping concentrations. The silicon mesa width between the trenches is inversely proportional to the p-charge in each zone, so the p doping concentration is reduce toward the edge of the die. The p-regions are connected to a top metal field plate. The gradient of p doping concentrations provides a more uniform electric field distribution for an increased breakdown voltage.

6. Beveled saw streets 170 (FIG. 30) between dies are formed by wet etching for very high voltage devices. A passivating layer (oxide 172) is formed over the beveled edge and saw street.

The above six inventions, respectively, are further summarized as follows:

1. A method of forming a vertical power device (FIGS. 12-14) comprising:
    providing a substrate 106, the substrate having a top surface and a bottom surface;
    doping a top surface region of the substrate with dopants of a first conductivity type (e.g., p-type), such that the top surface region of the substrate is a more highly doped first conductivity type than a bottom surface region of the substrate;
    growing an epitaxial layer 118 of a second conductivity type over the top surface of the substrate, and forming regions of the first conductivity type 28 and the second conductivity type 29, to form a vertical transistor structure;
    grinding down the bottom surface of the substrate;
    wet etching the ground-down bottom surface of the substrate, using the top surface region as an etch stop, to expose the top surface region;
    forming a first metal electrode 22 on the exposed top surface region after the wet etching; and
    forming a second metal electrode 20 over the epitaxial layers.

2. A termination structure for a transistor (FIGS. 20-25) comprising:
    a cell array 14 formed in a first semiconductor material 36 of a first conductivity type (e.g., n-type);
    concentric trenches 44 formed in the first semiconductor material surrounding the cell array;
    deep regions 130 of a second conductivity type formed below the trenches, where each deep region is associated with one of the trenches;
    a dielectric material 146 at least partially filling the trenches; and
    a conductive ring 136 overlying each of the trenches, each conductive ring being a floating field ring, wherein the dielectric material within each trench acts as a vertical spacer between the deep regions and the conductive ring, wherein a vertical depth difference between the deep region junction and its associated metal ring sets a voltage of each ring.

3. A vertical transistor structure (FIG. 2) comprising:
    first semiconductor material 42 of a first conductivity type (e.g., p-type);
    a first buffer layer 74 of a second conductivity type over the first semiconductor material, the first buffer layer having a first dopant concentration;
    a second buffer layer 76 of the second conductivity type formed over the first buffer layer, the second buffer layer having a second dopant concentration higher than the first dopant concentration, the second buffer layer forming lateral first regions separated by second regions of the first buffer layer;
    a second semiconductor material 36 of the second conductivity type formed over the second buffer layer and having a third dopant concentration lower than the first dopant concentration; and
    a cell array 14 formed in the second semiconductor material.

4. A vertical transistor (FIG. 2) comprising:
    a cell array 14 formed in a first semiconductor material 36 of a first conductivity type (e.g., n-type);
    concentric trenches 44 formed in the first semiconductor material surrounding the cell array;
    deep regions 56 of a second conductivity type formed below the trenches, where each deep region is associated with one of the trenches;
    shallower regions 57 of the second conductivity type between the trenches;
    a conductive material 46 filling the trenches;
    a substrate 42 of the second conductivity type vertically separated by the deep regions and the shallower regions at least by the first semiconductor material;
    a first electrode 22 formed on a bottom surface of the substrate; and
    a second electrode 20 formed overlying at least portions of the cell array and the trenches, wherein the deep regions and the shallower regions are electrically coupled 32/58 to the second electrode.

5. A method of forming a vertical transistor (FIGS. 27-29) comprising:
    forming a cell array 14 in a first semiconductor material 36 of a first conductivity type (e.g., n-type);
    forming concentric trenches 154 in the first semiconductor material surrounding the cell array, wherein spaces between trenches increase with distance away from the cell array;
    implanting first dopants of a second conductivity type into the trenches to form first regions of the second conductivity type below each trench;
    diffusing the first dopants to merge the first regions and form zones (zones 1-4) of the first dopants, wherein a dopant concentration of the first dopants decreases laterally with distance from the cell array due to the varying spaces between the trenches;
    coupling the merged first regions to a metal field plate;
    forming a first electrode 22 on a bottom surface of the transistor; and
    forming a second electrode 20 overlying at least portions of the cell array.

6. A vertical transistor die (FIG. 30) comprising:
    a cell array 14 in a first semiconductor material 36 of a first conductivity type (e.g., n-type);

an etched beveled edge 170 along outer edges of the die; and a passivating layer 172 formed over the beveled edge.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A vertical transistor die comprising:
   a cell array in a first semiconductor material of a first conductivity type;
   one or more electrodes formed on a top surface of the die having wire-bonding pad opening areas for wire bonding to package terminals;
   a bottom electrode, wherein all electrical connections to the transistor are made via the wire-bonding pad opening areas and via the bottom electrode;
   a beveled portion etched through the first semiconductor material and surrounding the cell array, the beveled portion of the first semiconductor material extending from a top surface of the die outward toward the bottom surface, wherein the beveled portion forms an outward slanting edge portion of the first semiconductor material of the die;
   a passivating layer formed over the beveled portion as an outer layer at the edge of the die, wherein no conductive material overlies any portion of the passivating layer over the beveled portions;
   a bottom semiconductor layer of a second conductivity type; and
   a buffer layer of the first conductivity type overlying the bottom semiconductor layer, wherein the first semiconductor material is formed overlying the buffer layer, wherein the buffer layer has a dopant concentration higher than a dopant concentration in the first semiconductor material, and wherein the beveled portion is etched through the first semiconductor material and at least into the buffer layer.

2. The die of claim 1 wherein the die is singulated from a wafer by cutting the wafer between beveled portions of adjacent transistor areas in the wafer.

3. The die of claim 1 wherein the beveled portion terminates in a reduced thickness portion forming the outer edges of the die.

4. The die of claim 1 wherein the cell array comprises vertical gates and a body region of the second conductivity type between the vertical gates, wherein the body region is configured for being inverted proximate to a vertical gate, when the vertical gate is electrically biased, for creating a conductive channel for turning on the transistor.

5. The die of claim 1 wherein the beveled portion increases a breakdown voltage of the die.

6. The die of claim 1 wherein the beveled portion is etched by a wet etchant.

7. A vertical transistor die comprising:
   a cell array in a first semiconductor material of a first conductivity type;
   one or more electrodes formed on a top surface of the die having wire-bonding pad opening areas for wire bonding to package terminals;
   a bottom electrode, wherein all electrical connections to the transistor are made via the wire-bonding pad opening areas and via the bottom electrode;
   a termination area surrounding the cell array between the cell array and the beveled portion;
   wherein the termination area comprises one or more trenches surrounding the cell array, wherein dopants of a second conductivity type are implanted into the trenches to form regions of the second conductivity type below the trenches; and
   a shield area between the cell array and the termination area, the shield area having a breakdown voltage that is less than a breakdown voltage of the cell array.

8. The die of claim 7 wherein the shield area comprises one or more additional trenches, with the dopants of the second conductivity type implanted through the additional trenches to form deep regions of the second conductivity type below the additional trenches.

* * * * *